(12) United States Patent
Kono

(10) Patent No.: US 11,954,604 B2
(45) Date of Patent: Apr. 9, 2024

(54) MAINTENANCE OPERATION ASSISTANCE SYSTEM

(71) Applicant: Hitachi, Ltd., Tokyo (JP)

(72) Inventor: Toshiaki Kono, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 811 days.

(21) Appl. No.: 17/053,601

(22) PCT Filed: May 9, 2019

(86) PCT No.: PCT/JP2019/018603
§ 371 (c)(1),
(2) Date: Nov. 6, 2020

(87) PCT Pub. No.: WO2019/225342
PCT Pub. Date: Nov. 28, 2019

(65) Prior Publication Data
US 2021/0080942 A1 Mar. 18, 2021

(30) Foreign Application Priority Data
May 24, 2018 (JP) ................................. 2018-099289

(51) Int. Cl.
*G06N 5/02* (2023.01)
*G05B 23/02* (2006.01)

(52) U.S. Cl.
CPC ............ *G06N 5/02* (2013.01); *G05B 23/0283* (2013.01)

(58) Field of Classification Search
None
See application file for complete search history.

(56) References Cited

U.S. PATENT DOCUMENTS 9,632,861 B1 4/2017 Watanabe et al.
2002/0049563 A1* 4/2002 Vetter .................. G05B 13/024
702/184

(Continued)

FOREIGN PATENT DOCUMENTS

EP 2 778 818 B1 4/2017
JP 2014-174983 A 9/2014

(Continued)

OTHER PUBLICATIONS

Extended European Search Report issued in European Application No. 19806532.8 dated Jan. 25, 2022 (nine (9) pages).

(Continued)

*Primary Examiner* — Lina Cordero
(74) *Attorney, Agent, or Firm* — Crowell & Moring LLP

(57) ABSTRACT

Provided is a maintenance operation assistance system comprising: a failure knowledge database wherein failure knowledge data is recorded; a failure knowledge coupling unit for reconstructing partial failure knowledge data into failure knowledge data; and an inspection procedure generation unit for presenting an inspection procedure using the reconstructed failure knowledge data. The failure knowledge coupling unit evaluates and adjusts the relatedness of nodes among different instances of partial failure knowledge data, and connects the different instances of partial failure knowledge data. On the basis of the reconstructed failure knowledge data, the inspection procedure generation unit sets priorities for when presenting the inspection procedure, and presents the inspection procedure to a diagnostic interface unit in accordance with the priorities.

10 Claims, 25 Drawing Sheets

(56) References Cited

U.S. PATENT DOCUMENTS

| | | | |
|---|---|---|---|
| 2010/0174438 A1 | 7/2010 | Takahashi | |
| 2011/0137697 A1* | 6/2011 | Yedatore | G06F 11/0748 |
| | | | 702/184 |
| 2011/0264424 A1 | 10/2011 | Miwa et al. | |
| 2013/0332383 A1* | 12/2013 | Anzai | G05B 23/0275 |
| | | | 705/325 |
| 2014/0365178 A1* | 12/2014 | Schramm | G05B 23/0283 |
| | | | 702/184 |
| 2015/0178984 A1 | 6/2015 | Tateishi et al. | |
| 2017/0017537 A1 | 1/2017 | Razin et al. | |
| 2017/0186105 A1* | 6/2017 | Smith | G06Q 50/02 |

FOREIGN PATENT DOCUMENTS

| | | |
|---|---|---|
| JP | 2017-111601 A | 6/2017 |
| WO | WO 2008/038469 A1 | 4/2008 |
| WO | WO 2014/017385 A1 | 1/2014 |

OTHER PUBLICATIONS

International Search Report (PCT/ISA/210) issued in PCT Application No. PCT/JP2019/018603 dated Jul. 23, 2019 with English translation (four (4) pages).

Japanese-language Written Opinion (PCT/ISA/237) issued in PCT Application No. PCT/JP2019/018603 dated Jul. 23, 2019 (five (5) pages).

* cited by examiner

| No. | PARTIAL KNOWLEDGE ID | COMPONENT ID | COMPONENT | FAILURE MODE ID | FAILURE MODE | FAILURE EFFECT ID |
|---|---|---|---|---|---|---|
| 1 | KNOWLEDGE 1 | P1 | DOOR | M1.1.1 | NOT OPENABLE | E1.1.1 |
| 2 | KNOWLEDGE 1 | P1 | DOOR | M1.1.2 | OPENING TIME IS LONG | E1.1.2 |
| 3 | KNOWLEDGE 1 | P1 | DOOR | M1.1.2 | OPENING TIME IS LONG | E1.1.2 |
| 4 | KNOWLEDGE 1 | P1 | DOOR | M1.1.3 | OPENING TIME IS SHORT | E1.1.3 |
| 5 | KNOWLEDGE 1 | P2 | DOOR RAIL | M1.2.1 | RESISTANCE INCREASE | E1.2.1 |
| 6 | KNOWLEDGE 1 | P2 | DOOR RAIL | M1.2.1 | RESISTANCE INCREASE | E1.2.1 |
| 7 | KNOWLEDGE 1 | P3 | DOOR LEAF | M1.3.1 | RESISTANCE INCREASE | E1.3.1 |
| 8 | KNOWLEDGE 2 | P4 | ACTUATOR | M2.4.1 | VERY-LOW ACTUATING FORCE | E2.4.1 |
| 9 | KNOWLEDGE 2 | P4 | ACTUATOR | M2.4.1 | VERY-LOW ACTUATING FORCE | E2.4.1 |
| 10 | KNOWLEDGE 2 | P4 | ACTUATOR | M2.4.2 | VERY-HIGH ACTUATING FORCE | E2.4.2 |
| 11 | KNOWLEDGE 2 | P5 | PISTON | M2.5.1 | RESISTANCE INCREASE | E2.5.1 |
| 12 | KNOWLEDGE 2 | P6 | CYLINDER | M2.6.1 | ALIGNMENT ABNORMALITY | E2.6.1 |
| 13 | KNOWLEDGE 2 | P7 | AIR PIPE | M2.7.1 | AIR FLOW LEAKAGE | E2.6.7 |
| 14 | KNOWLEDGE 3 | P8 | ADJUSTMENT VALVE | M3.8.1 | VERY-SMALL AIR FLOW PATH | E3.8.1 |
| 15 | KNOWLEDGE 3 | P8 | ADJUSTMENT VALVE | M3.8.2 | VERY-LARGE AIR FLOW PATH | E3.8.2 |
| 16 | KNOWLEDGE 3 | P8 | ADJUSTMENT VALVE | M3.8.3 | FLOW RATE UNSETTABLE | E3.8.3 |
| 17 | KNOWLEDGE 4 | P8 | ADJUSTMENT VALVE | M4.9.1 | VERY-SMALL AIR FLOW PATH | E4.9.1 |
| 18 | KNOWLEDGE 4 | P8 | ADJUSTMENT VALVE | M4.9.2 | VERY-LARGE AIR FLOW PATH | E4.9.1 |
| 19 | KNOWLEDGE 4 | P8 | ADJUSTMENT VALVE | M4.9.2 | VERY-LARGE AIR FLOW PATH | E4.9.2 |
| 20 | KNOWLEDGE 4 | P8 | ADJUSTMENT VALVE | M4.9.3 | AIR FLOW PATH CLOGGING | E4.9.3 |
| 21 | KNOWLEDGE 4 | P8 | ADJUSTMENT VALVE | M4.9.4 | AIR LEAKAGE | E4.9.4 |

FIG. 2A

| FAILURE EFFECT 34 | | | | FAILURE CAUSE 35 | |
|---|---|---|---|---|---|
| EFFECT DESCRIPTION | SAFETY EFFECT | OPERATION EFFECT | FAILURE CAUSE ID | FAILURE CAUSE | |
| PASSENGER CANNOT GET ON/OFF | LOW | HIGH | C1.1.1 | DOOR LEAF DOES NOT MOVE |
| OPERATION DELAY | LOW | MIDDLE | C1.1.2 | DOOR OPEN DETECTION FAILURE |
| OPERATION DELAY | LOW | MIDDLE | C1.1.3 | DOOR LEAF MOVEMENT IS SLOW |
| PASSENGER IS CAUGHT | HIGH | MIDDLE | C1.1.4 | DOOR LEAF MOVEMENT IS FAST |
| MOVEMENT OF DOOR LEAF IS INHIBITED, ABNORMAL SOUND | LOW | MIDDLE | C1.2.1 | INGRESS OF FOREIGN MATTER |
| MOVEMENT OF DOOR LEAF IS INHIBITED, ABNORMAL SOUND | LOW | MIDDLE | C1.2.2 | LOSS OF GREASE |
| MOVEMENT OF DOOR LEAF IS INHIBITED, ABNORMAL SOUND | MIDDLE | MIDDLE | C1.3.1 | DOOR LEAF DEFORMATION |
| MOVEMENT IS SLOW | LOW | MIDDLE | C2.4.1 | RESISTANCE INCREASE |
| MOVEMENT IS SLOW | LOW | MIDDLE | C2.4.2 | VERY-LOW AIR FLOW RATE |
| MOVEMENT IS FAST | HIGH | LOW | C2.4.3 | VERY-HIGH AIR FLOW RATE |
| MOVEMENT INHIBITION, ABNORMAL SOUND | LOW | MIDDLE | C2.5.1 | LOSS OF GREASE |
| MOVEMENT INHIBITION, STOP ON WAY, ABNORMAL SOUND | MIDDLE | LOW | C2.6.1 | LOSS ATTACHMENT |
| ACTUATING FORCE DECREASE, LEAK SOUND | LOW | HIGH | C2.7.1 | CRACK |
| AIR FLOW RATE DECREASE | LOW | MIDDLE | C3.8.1 | WRONG VALVE SETTING(CLOSE) |
| AIR FLOW RATE INCREASE | MIDDLE | MIDDLE | C3.8.2 | WRONG VALVE SETTING(OPEN) |
| AIR FLOW RATE UNSTABLE | MIDDLE | MIDDLE | C3.8.3 | LOOSE ADJUSTMENT UNIT |
| AIR FLOW RATE DECREASE | LOW | MIDDLE | C4.9.1 | WRONG VALVE SETTING(CLOSE) |
| AIR FLOW RATE DECREASE | LOW | MIDDLE | C4.9.2 | WRONG VALVE SETTING(CLOSE) |
| VERY-HIGH AIR FLOW RATE | LOW | MIDDLE | C4.9.3 | OPENING DUE TO VALVE FAILURE |
| AIR DOES NOT FLOW | LOW | MIDDLE | C4.9.4 | FOREIGN MATTER CLOGGING |
| AIR FLOW RATE DECREASE, LEAK SOUND | LOW | MIDDLE | C4.9.5 | WRONG VALVE SETTING(CLOSE) |

FIG. 2B

| PARTIAL KNOWLEDGE ID | SOURCE NODE | DESTINATION NODE |
|---|---|---|
| 1 | M1.1.1 | P1 |
| 1 | M1.1.2 | P1 |
| 1 | M1.1.3 | P1 |
| 1 | M1.1.1 | E1.1.1 |
| 1 | C1.1.1 | M1.1.1 |
| 1 | M1.1.2 | E1.1.2 |
| 1 | M1.1.3 | E1.1.2 |
| 1 | M1.1.3 | E1.1.3 |
| 1 | C1.1.2 | M1.1.2 |
| 1 | C1.1.3 | M1.1.2 |
| 1 | C1.1.4 | M1.1.3 |
| 1 | E1.2.1 | C1.1.1 |
| 1 | E1.2.1 | C1.1.3 |
| 1 | E1.3.1 | C1.1.1 |
| 1 | E1.3.1 | C1.1.3 |
| ... | ... | ... |

200

| CONNECTION SOURCE | CONNECTION DESTINATION | SCORE |
|---|---|---|
| FAILURE EFFECT | FAILURE CAUSE | 1 |
| FAILURE EFFECT | FAILURE MODE | 0.5 |
| FAILURE EFFECT | FAILURE EFFECT | 0.25 |
| FAILURE MODE | FAILURE CAUSE | 0.75 |
| FAILURE MODE | FAILURE MODE | 0.5 |
| FAILURE MODE | FAILURE EFFECT | 0.25 |
| FAILURE CAUSE | FAILURE MODE | 0.25 |
| FAILURE CAUSE | FAILURE EFFECT | 0.1 |
| FAILURE CAUSE | FAILURE CAUSE | 0.5 |
| COMPONENT | FAILURE CAUSE | 0.5 |
| COMPONENT | FAILURE MODE | 0.5 |
| COMPONENT | FAILURE EFFECT | 0.25 |

| CONNECTION SOURCE | | CONNECTION DESTINATION | | SCORE |
|---|---|---|---|---|
| PARTIAL KNOWLEDGE ID | NODE ID | PARTIAL KNOWLEDGE ID | NODE ID | |
| KNOWLEDGE 2 | P4 | KNOWLEDGE 1 | P1 | 2.5 |
| KNOWLEDGE 1 | P1 | KNOWLEDGE 2 | P4 | 2.5 |
| KNOWLEDGE 2 | P4 | KNOWLEDGE 1 | P2 | 1.5 |
| KNOWLEDGE 2 | P4 | KNOWLEDGE 1 | P3 | 1.5 |
| ... | | | | |
| KNOWLEDGE 2 | P4 | KNOWLEDGE 1 | C1.2.2 | 1.5 |
| KNOWLEDGE 2 | P4 | KNOWLEDGE 1 | C1.3.1 | 1.5 |
| ... | | | | |
| KNOWLEDGE 2 | E2.4.1 | KNOWLEDGE 1 | C1.1.3 | 5 |
| KNOWLEDGE 2 | E2.4.2 | KNOWLEDGE 1 | C1.1.3 | 2 |
| ... | | | | |

FIG. 8

| CONNECTION SOURCE | | CONNECTION DESTINATION | | SCORE |
|---|---|---|---|---|
| PARTIAL_KNOWLEDGE ID | NODE ID | PARTIAL_KNOWLEDGE ID | NODE ID | |
| KNOWLEDGE 2 | P4 | KNOWLEDGE 1 | P1 | 2.5 |
| KNOWLEDGE 2 | E2.4.1 | KNOWLEDGE 1 | C1.1.3 | 5 |
| ... | | ... | | |

| HIGHER EFFECT | FAILURE MODE OF INTEREST | LOWER-CAUSE |
|---|---|---|
| FAILURE EFFECT: MOVEMENT IS ABNORMALLY SLOW | COMPONENT: ACTUATOR FAILURE MODE: VERY-LOW ACTUATING FORCE | FAILURE CAUSE: RESISTANCE INCREASE |
| COMPONENT: DOOR | NO APPEARANCE / FAULT IDENTIFICATION | COMPONENT: PISTON FAILURE EFFECT: MOVEMENT INHIBITION, ABNORMAL SOUND |
|  | SAME COMPONENT FAILURE MODE | COMPONENT: CYLINDER FAILURE EFFECT: MOVEMENT INHIBITION, ABNORMAL SOUND |
|  | FAILURE MODE: VERY-HIGH ACTUATING FORCE | FAILURE CAUSE: VERY-LOW AIR FLOW RATE |
|  |  | COMPONENT: AIR PIPE FAILURE EFFECT: AIR SUPPLY DECREASE, LEAK SOUND |
|  |  | COMPONENT: ADJUSTMENT VALVE FAILURE EFFECT: AIR FLOW RATE DECREASE |
|  |  | COMPONENT: ADJUSTMENT VALVE FAILURE EFFECT: AIR DOES NOT FLOW |
|  |  | COMPONENT: ADJUSTMENT VALVE FAILURE EFFECT: AIR DOES NOT FLOW |
|  |  | COMPONENT: ADJUSTMENT VALVE FAILURE EFFECT: AIR FLOW RATE UNSTABLE |

| INSPECTION ITEM ID | INSPECTION TARGET ID | INSPECTION TYPE | INSPECTION METHOD |
|---|---|---|---|
| IN001 | M1.2.1 | MANUAL | DOOR LEAF IS DETACHED FROM ACTUATOR, RESISTANCE IN MOVEMENT OF DOOR LEAF MEASURED USING TORQUE GAUGE, AND RESISTANCE IS COMPARED WITH REFERENCE VALUE |
| IN002 | M2.7.1 M4.9.4 | MANUAL | CONFORM LEAK SOUND DUE TO ULTRASONIC SENSOR |
| IN003 | M3.8.1 M3.8.3 | AUTOMATIC | PRESSURE P LOWER LIMIT OF SPECIFIED VALUE < P < UPPER LIMIT OF SPECIFIED VALUE DURING DOOR OPERATION |
| IN004 | M3.8.3 | MANUAL | LARGE FLUCTUATION IS NOT FOUND IN PRESSURE VALUE DURING DOOR OPERATION |
| ⋮ | ⋮ | ⋮ | ⋮ |

FIG. 20

MAINTENANCE OPERATION ASSISTANCE SYSTEM

TECHNICAL FIELD

The present invention relates to a maintenance operation assistance system.

BACKGROUND ART

In many fields such as infrastructure, railways, industrial equipment, and medical equipment, it is necessary to continuously perform maintenance after assets (various equipment) are introduced in order to maintain predetermined performance. In the maintenance, a state of the asset is collected, and an appropriate maintenance operation is applied after a diagnosis for analyzing whether or not an abnormality occurs or a problem occurs is applied.

In the diagnosis of the asset, a faulty asset, a faulty part, and a measure such as replacement, repair, or restoration to be performed is generally specified based on an inspection result of the asset performed by a maintenance operator and a state of the asset acquired by a sensor. In order to perform the specification thereof, the maintenance operator needs to have a knowledge and a general engineering knowledge of the asset.

In recent years, as an information technology has become developed, it has become easier to use an IT technology such as a diagnostic technology for collecting the state of the asset with the sensor and grasping a current state of the asset, and diagnosis assistance using the IT technology has been examined. A diagnosis assistance technology for assisting an efficient inspection order by appropriately instructing an inspection portion and an inspection content of the asset and supplementing the lack of the knowledge and engineering knowledge of the maintenance operator regarding the asset has been put into practical use.

In order to realize a maintenance operation assistance system equipped with such a diagnosis assistance technology, for example, a maintenance operation assistance system having faulty parts candidate and inspection means for guiding an inspection portion to the maintenance operator, failure knowledge data in which a relation between a phenomenon and a failure is described, and guide providing means for presenting the data in an order is considered.

As an example of the maintenance operation assistance system having the failure knowledge data and the guide providing means, PTL 1 describes a method including "a step of providing a failure knowledge database of a target system, a data record specifying a failure mode and a failure indication, a step of receiving a specific component and a report, a step of specifying a candidate failure mode and an indication data record while referring the failure knowledge database, a step of calculating reliabilities of candidate data records, a step of comparing the reliabilities, and a step of generating a maintenance command. The method further includes a step of providing a correction database of the failure indication to a subset of the failure knowledge database. A replacement component and a replacement failure indication have a failure mode and an indication data record. In the specifying step, the number of candidate failure modes and the number of indication data records including the replacement component and the replacement failure indication are expanded by using the correction database (extracted from Abstract)".

CITATION LIST

Patent Literature

PTL 1: JP 2014-174983 A

SUMMARY OF INVENTION

Technical Problem

When the diagnosis assistance is performed by using the failure knowledge data, the failure knowledge data (1) describes a failure candidate of a target asset and a related phenomenon with a high coverage and (2) describes a knowledge having a configuration in which structural and functional configurations of the asset are followed in order or describe a knowledge with no inconsistency or duplication as a whole, it is necessary for the maintenance operator to clearly recognize an operation procedure and easily narrow down the faulty parts.

However, it is necessary to perform a consistent management, a large-scale knowledge extraction operation and description operation when the failure knowledge data described above is created. It is necessary to maintain consistency by adjusting the entire contents when the knowledge data is updated. Accordingly, a burden of creating and updating the knowledge data becomes extremely large, and such a burden becomes a problem in constructing the diagnosis assistance system.

Thus, an object of the present invention is to provide a highly practical maintenance operation assistance system that suppresses a burden of creating failure knowledge data by creating the failure knowledge data with a small scale in a distributed manner and creates a diagnosis procedure for instructing an appropriate procedure to a maintenance operator even though the failure knowledge data is created in such a distributed manner.

Solution to Problem

In order to solve the problems, the present invention provides a maintenance operation assistance system including a failure knowledge database in which failure knowledge data regarding a failure of an asset is recorded, a failure knowledge coupling unit that reconstructs, as the failure knowledge data, instances of partial failure knowledge data which are instances of the failure knowledge data created by being partially divided, and an inspection procedure generation unit that presents an inspection procedure to a maintenance operator by using the reconstructed failure knowledge data. The failure knowledge coupling unit evaluates and adjusts a relatedness between description contents of instances of different partial failure knowledge data in nodes, connects the instances of different partial failure knowledge data, and reconstructs the instances of connected different partial failure knowledge data as the failure knowledge data, and the inspection procedure generation unit sets priorities when an inspection procedure is presented to the maintenance operator by the reconstructed failure knowledge data, and presents the inspection procedure to a diagnostic interface unit based on the priorities.

Advantageous Effects of Invention

According to the present invention, it is possible to realize an efficient maintenance operation of reducing man-hours to create all instances of failure knowledge data by constructing the failure knowledge data obtained by integrating individual partial failure knowledges and realizing failure diagnosis assistance in a combination of a plurality of instances of failure knowledge data failure knowledge data.

BRIEF DESCRIPTION OF DRAWINGS

FIG. 2 is a diagram illustrating an example of failure knowledge data.

FIG. 7 is a diagram illustrating an example of a relation score table.

FIG. 8 is a diagram illustrating an example of a score table.

FIG. 9 is a diagram illustrating an example of an adjusted score table.

FIG. 15 is a diagram illustrating an example of a failure inspection GUI.

FIG. 20 is a diagram illustrating an example of inspection procedure data.

DESCRIPTION OF EMBODIMENTS

Hereinafter, embodiments will be described with reference to the drawings. The present invention is not limited to the following embodiments, and various modifications and applications can be made within a technical concept of the present invention.

First Embodiment

Figure 1:
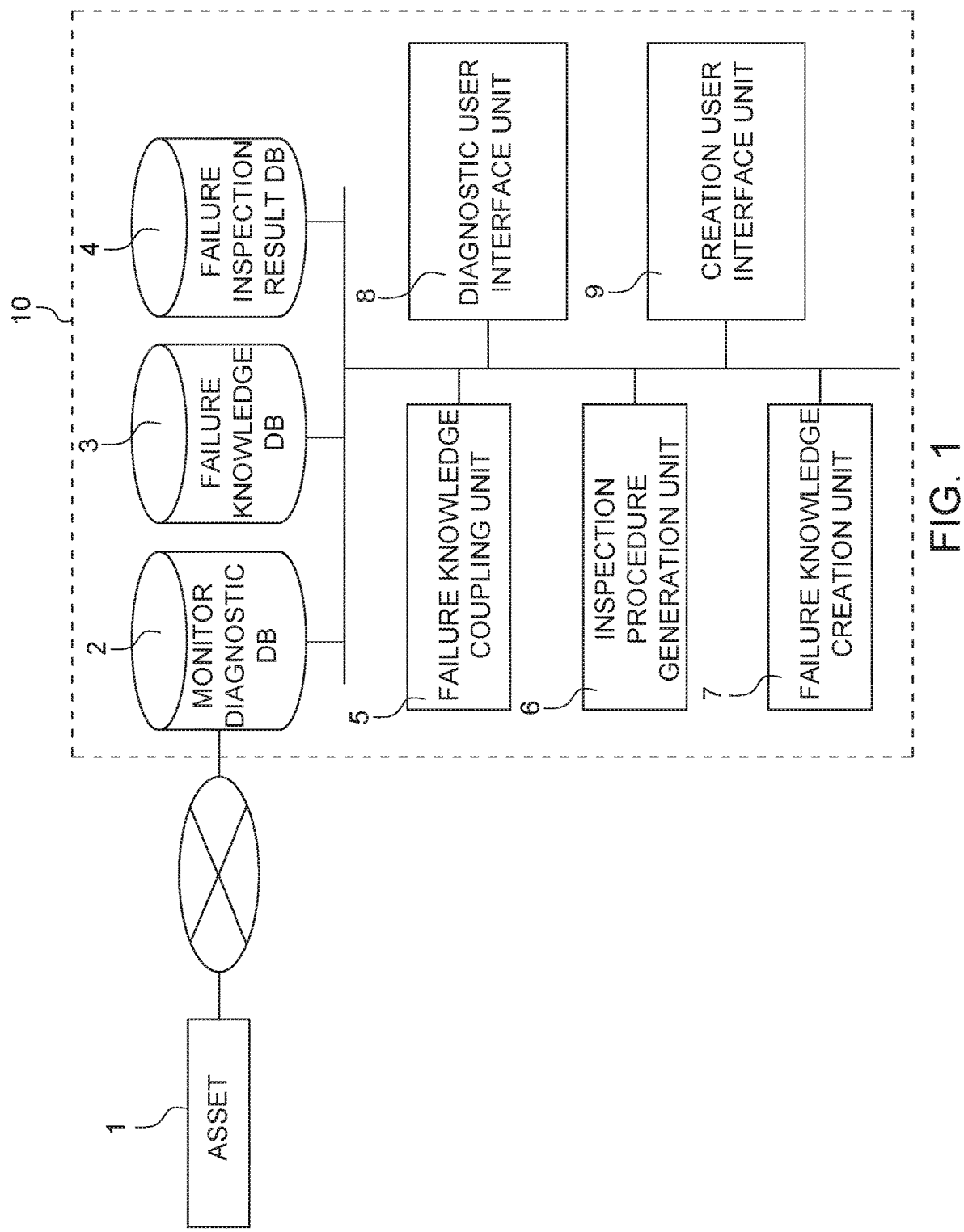
FIG. 1 is a configuration diagram of a fault identification assistance system in a first embodiment.

FIG. 1 is a configuration diagram illustrating a fault identification assistance system 10 for an asset 1. The fault identification assistance system 10 includes, for example, a monitor diagnostic database 2 including sensor measurement values obtained from the asset 1, a failure knowledge database 3 in which failure knowledge data such as asset failure is recorded, a failure inspection result database 4, and a processing device that includes a failure knowledge coupling unit 5 that reconstructs instances of partial failure knowledge data (definition will be described later) as failure knowledge data, an inspection procedure generation unit 6 that presents an inspection procedure to maintenance operators, a failure knowledge creation unit 7, a diagnostic user interface unit (diagnostic interface unit) 8, and a creation user interface unit 9. Although each of the databases 2 to 4 is realized by storage means such as a hard disk drive (HDD) or a random access memory (RAM), each of the units 5 to 7 is realized by a program recorded in a central processing unit (CPU), a read only memory (ROM), or a RAM, and each of the interface units 8 to 9 is realized by an input and output device such as a touch panel and a combination of a display and a keyboard (a PC, a tablet terminal, a mobile phone, or the like), the present invention is not limited thereto. The roles of these databases and units will be described in detail below.

Although the present invention is not limited to a specific asset, a diagnostic technology, and an analysis technology, a diagnosis of a passenger cabin door of a railway will be described as an example in the following description.

A structure of the asset 1, a failure mode, a relatedness between a functional failure and the failure mode, a relatedness between the functional failure and a failure effect, and a relatedness between a phenomenon observed at the time of failure and the failure mode are recorded as failure knowledge data 30 in the failure knowledge database 3. The failure knowledge data 30 does not need to include a failure knowledge of the entire asset 1 and the relatedness, and a failure knowledge created for each part of a structure or a function of a target knowledge may be saved. It is assumed that structural development data of the entire target asset is also recorded.

FIG. 2 is a diagram illustrating an example of failure knowledge data 30A. Information regarding a partial knowledge ID 31, a target component 32, a failure mode 33, a failure cause 35 causing the failure mode, and a failure effect 34 due to the failure mode is included in the failure knowledge data 30A. It is not necessary to create the whole data at once, but the failure knowledge data 30A is created for each part by a partial expert knowledge holder for the asset or by adding data corresponding to a creation version. A division status of the knowledge data accompanying the division of the creation is recorded as the partial knowledge ID 31.

Figure 3:
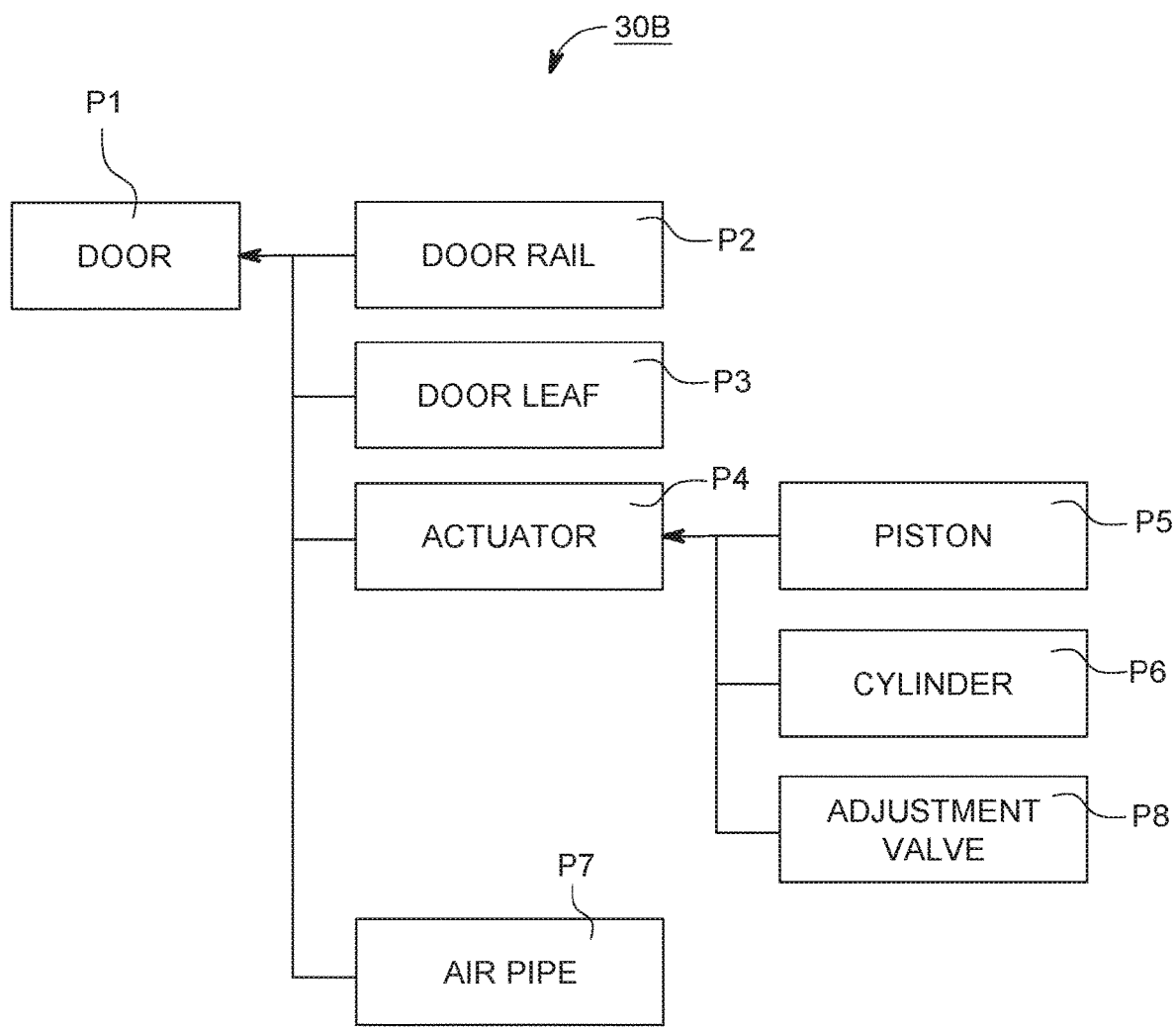
FIG. 3 is a diagram illustrating an example of data illustrating a structural development of an asset.

Data 30B indicating a structural development of the asset 1 illustrated in FIG. 3 is recorded in the failure knowledge database 3. FIG. 3 illustrates a conceptual diagram of the data 30B such that the structural development of the components constituting the asset 1 is clear, but this data is recorded in a table format (the table is not illustrated). Here, constituent components of a door P1 include a door rail P2, a door leaf P3, an actuator P4, and an air pipe P7, and constituent components of the actuator P4 include a piston P5, a cylinder P6, and an adjustment valve P8.

Referring back to FIG. 2, each row (No. 1 to No. 21 in FIG. 2) of the failure knowledge data 30A indicates a combination of the target component 32, the failure mode 33, the failure cause 35, and the failure effect 34, and is handled as the smallest unit of the failure knowledge.

Here, it is possible to describe which factor causes the failure effect in the failure knowledge database 3 by describing the relatedness between the failure cause and the failure effect among elements recorded in the failure knowledge data 30A. Regarding the failure effect that appears in a certain target component, which failure mode causes the failure effect and which failure cause causes the failure mode are described as a relatedness between data IDs.

It is possible to describe a causal relation chain in which when a failure appears in a component that provides a subordinate function, the failure effect is the failure cause of the superordinate function for different components.

As described above, the failure knowledge data 30A is a combination of data created by being partially divided. As stated above, the data created by being partially divided is called partial failure knowledge data (or a partial knowledge). The partial failure knowledge data is recorded in the failure knowledge database 3 in the table format.

Figure 4:
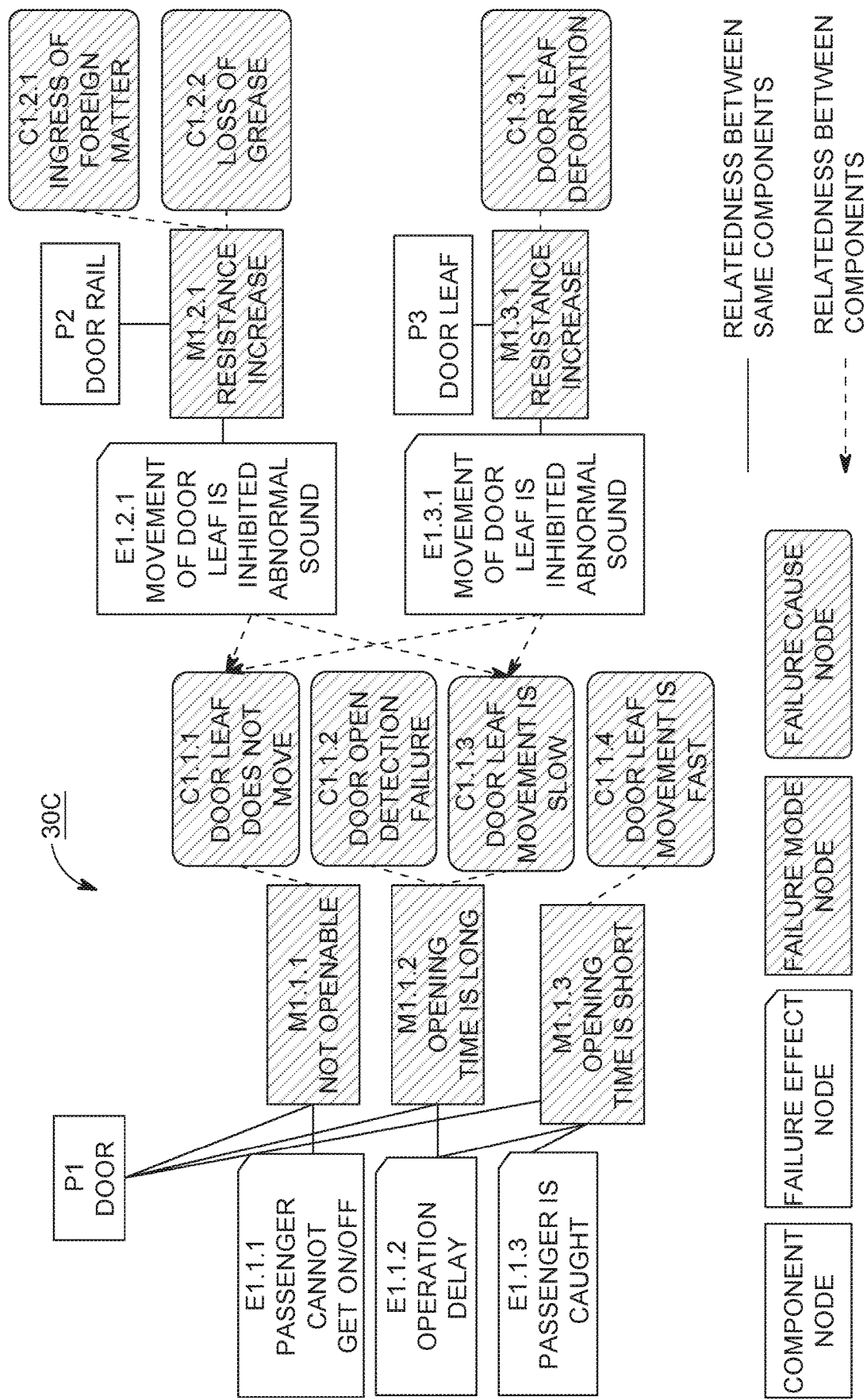
FIG. 4 is a diagram illustrating partial failure knowledge data in a graph format.
Figures 5, 6:
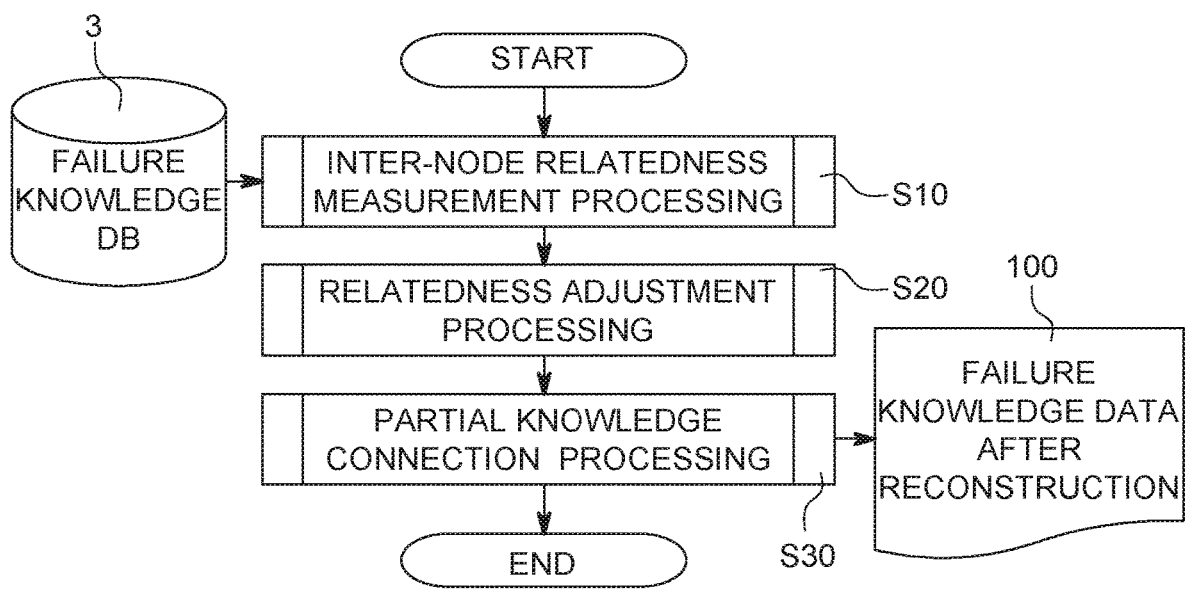
FIG. 5 is a diagram illustrating the partial failure knowledge data in a table format.
FIG. 6 is a flowchart illustrating processing of a failure knowledge coupling unit.

The partial failure knowledge data indicates a relatedness between the failure cause and the failure effect between elements. FIGS. 4 and 5 are diagrams illustrating partial failure knowledge data 30C, and illustrate the relatedness described above in a graph format and a table format, respectively. As illustrated in FIG. 4, the partial failure knowledge data 30C indicates the relatedness between the same components by solid lines and the relatedness between different components by broken lines for nodes of the target component, the failure mode, the failure cause, and the failure effect. As illustrated in FIG. 5, the relatedness thereof is recorded as a partial knowledge ID 36, a source node 37, and a destination node 38. In the following description, the partial failure knowledge data 30C will be described mainly using the graph format.

Even with only the partial failure knowledge data 30C, the failure inspection can be partially performed. For example, in a case where the maintenance operator receives a report of "door opening is abnormally slow and operation is delayed", when an inspection of the door is actually performed after starting from a failure effect node of "operation delay" indicated by E1.1.2 and a failure mode node of "opening time is long" indicated by M1.1.2 and a failure cause mode of "loss of grease" indicated by C1.2.2 can be finally confirmed after tracing a failure cause mode of "leaf movement time is slow" indicated by C1.1.3, a failure effect node of "movement of door leaf is inhibited" indicated by E1.2.1, and a failure mode node of "resistance increase" indicated by M1.2.1, a measure of "grease is added to door rail P2" can be performed.

However, it is not possible to inspect details for a failure cause mode of "door leaf movement speed is fast" indicated by C1.1.4. As described above, in the case of the partial failure knowledge data 30C, since the failure knowledge is created only for each part, a failure inspection limited to a range in which the partial knowledge ID 36 is "1" is performed. Thus, even though the partial failure knowledge data 30C having the partial knowledge ID 36 of "1" and the partial failure knowledge data 30C having another partial knowledge ID 36 have the relatedness of each node of the target component, the failure mode, the failure cause, and the failure effect, it is not possible to perform an efficient failure inspection only with the partial failure knowledge data 30C having the partial knowledge ID 36 of "1".

When the partial failure knowledge data 30C having another partial knowledge ID 36 includes a failure knowledge related to the actuator P4 and "when the actuator P4 exerts excessive force, an abnormality such that the door leaf movement quickly occurs" is recorded in the failure knowledge data, it is possible to perform an efficient failure inspection. That is, even though the partial knowledge IDs are different, since there is a possibility that the partial knowledges have the relatedness of the target component, the failure mode, the failure cause, and the failure effect, it is necessary to reconstruct a plurality of instances of partial failure knowledge data 30C as an integrated failure knowledge data 30A.

When there is an attempt to reconstruct the failure knowledge data 30A, even though a connection relation between the instances of partial failure knowledge data having different partial knowledge IDs 36 (hereinafter, referred to as "instances of different partial failure knowledge data") 30C is manually defined, the failure knowledge data is often defined only by the maintenance operator who has expert knowledge for each asset in a large-scale device or a complicated device, and the number of partial failure knowledge data becomes enormous.

It is also considered that the failure knowledge data is created at different times. Man-hours to create the failure knowledge data become more realistic than a case where the instances of failure knowledge data are created by a plurality of persons or a case where the failure knowledge data or all the instances of failure knowledge data are created all at once at different times. However, since a plurality of connection points is confirmed among maintenance operators and an operation of defining an accurate cause-effect is performed, it is difficult to manually define the relatedness between the instances of partial failure knowledge data.

When such inspection knowledge data is created, it is necessary to define the relatedness between the knowledges at an appropriate connection point in accordance with the function and structural development of the asset. Since there may be duplication or inconsistency in the individually created knowledge, it is necessary to create data for which a display order and display or not are considerable when a guide is presented to the maintenance operator.

Accordingly, when the failure knowledge data 30A is reconstructed, it is necessary to automatically search for the connection relation between the instances of different partial failure knowledge data 30C.

The reconstruction of the partial failure knowledge data 30C is executed in the failure knowledge coupling unit 5. FIG. 6 is a flowchart illustrating processing of the failure knowledge coupling unit 5.

First, the failure knowledge coupling unit 5 executes inter-node relatedness measurement processing of evaluating a relatedness between description contents at each node between the instances of different partial failure knowledge data 30C (S10). Here, a score X indicating a node relatedness between the instances of different partial failure knowledge data 30C is calculated in consideration of a textual similarity between the description contents at the node, a coincidence of node types, a distance in the structural development, and the like.

For example, when two nodes are compared, it is considered that a ratio W of the number of matching words in the description contents of each node to the total number of words, a relation score S corresponding to the type of the connected node (see a relation score table 200 illustrated in FIG. 7), and a distance L between the components in the structural development illustrated in FIG. 3 are used.

Here, the "matching word" in the calculation of W is not limited to a directly matching word, but includes a synonym. In the case of the antonym, the ratio W may be adjusted to be lowered. Regarding the relation score S, a connection of "failure effect-failure cause" indicating the most appropriate causal relation (a node connection) has a high score, but another connection of "failure mode-failure cause" and the like also have scores. Originally, when there are certain target components A and B, there may be a causal relation chain such as "failure mode of A-failure effect of A-failure cause-B". However, an appropriate failure effect of A is not merely extracted while the partial failure knowledge is examined, and there is a possibility that there is the causal relation in reality. Similarly for other causal relations, scores are set even though there is no node to be present in the middle. The distance L is defined as L=N+1 when N is the number of intermediate components present between the components in the structural development.

By such a method, weighting factors are calculated as A, B, and C, and the score is calculated as X=A×W+B×S+C/L. FIG. 8 illustrates, as an example of the score X indicating the node relatedness between the instances of different partial failure knowledge data 30C, a score table 300 calculated between data related to the actuator P4 of the partial failure knowledge data 30C having the partial knowledge ID 36 of "2" and the partial failure knowledge data 30C having the partial knowledge ID 36 of "1".

For example, whether or not there are a direct connection and an input and output relation between the components or after a spatial distance in the arrangement may be considered in the calculation of the score X. For example, since the actuator P4 directly drives the door leaf P3, a score between the node related to the actuator P4 and the node related to the door leaf P3 may be higher than a score between the node related to the actuator P4 and the node related to the door rail P2. In a past failure history, when there is a relatedness between the cause of the failure, the effected component, and the failure mode, the score may be created by using the relatedness.

The failure knowledge coupling unit 5 executes relatedness adjustment processing of adjusting the created relatedness and score (S20). First, when the score X is lower than a threshold value T (for example, T=2), since there is no relatedness in reality, this score is deleted from the score table 300 illustrated in FIG. 8.

Since the connection of the causal relation is considered, it is considered that the connection relation from the lower function to the higher function is appropriate, but the connection relation from the higher function to the lower function is inappropriate. As a method of solving such an inappropriate connection relation, when there is a function development diagram, the connection relation that is the relation from the higher function to the lower function is deleted from the connection relation. When there is no function development diagram, the structural development diagram is used. This is because it seems reasonable that a function of a structurally large component is generally realized by a function of a component included in the structurally large component. Thus, the connection relation from the higher component to the lower component is deleted by using an inclusion relation appearing in the structural development diagram. In the present embodiment, the connection from the door P1 to the actuator P4 can be deleted by using the structural development diagram illustrated in FIG. 3.

FIG. 9 illustrates an adjusted score table 310 after the relatedness adjustment processing (S20) is executed on the score table 300 illustrated in FIG. 8. Here, data having the score X lower than 2 and data of which the node ID of a connection source is P1 and the node ID of a connection destination is P4 are deleted.

Subsequently, the failure knowledge coupling unit 5 executes partial knowledge connection processing (S30) of connecting the instances of different partial failure knowledge data based on the adjusted score table 310 adjusted in the relatedness adjustment processing (S20) and reconstructing the instances of partial knowledge connection as the failure knowledge data.

In the partial knowledge connection processing (S30), integration processing of the failure knowledges described for the same components such as instances of data of which the partial knowledge IDs 31 are "knowledge 3" and "knowledge 4" in the failure knowledge data 30A illustrated in FIG. 2 is performed. At this time, when it is determined that the similarity is high from the similarity of the description content, since the nodes of the failure mode, the effect description, and the cause description have the same contents, these nodes are integrated into a single node. The similarity at this time can be implemented by matching from words or word meaning dictionaries.

There is a possibility that the description content is inconsistent when this integration processing is performed. For example, in the case of the failure knowledge data 30A illustrated in FIG. 2, there is a possibility that description contents of a safety effect and an operation effect are different by the evaluation of different creators. In this case, an average of the contents is first obtained. For example, when the evaluation of one safety effect is "high" and the evaluation of the other safety effect is "low", the evaluations of the safety effects are integrated as "middle". Alternatively, it is determined that as the number of nodes associated with the component is large in each knowledge, a result obtained by performing a more detailed analysis, and the content of the partial knowledge having the larger number of nodes is prioritized. For example, in the case of FIG. 2, since the knowledge 4 has a larger number of associated nodes, the content of the knowledge 4 has priority over the knowledge 3.

Figure 10A:
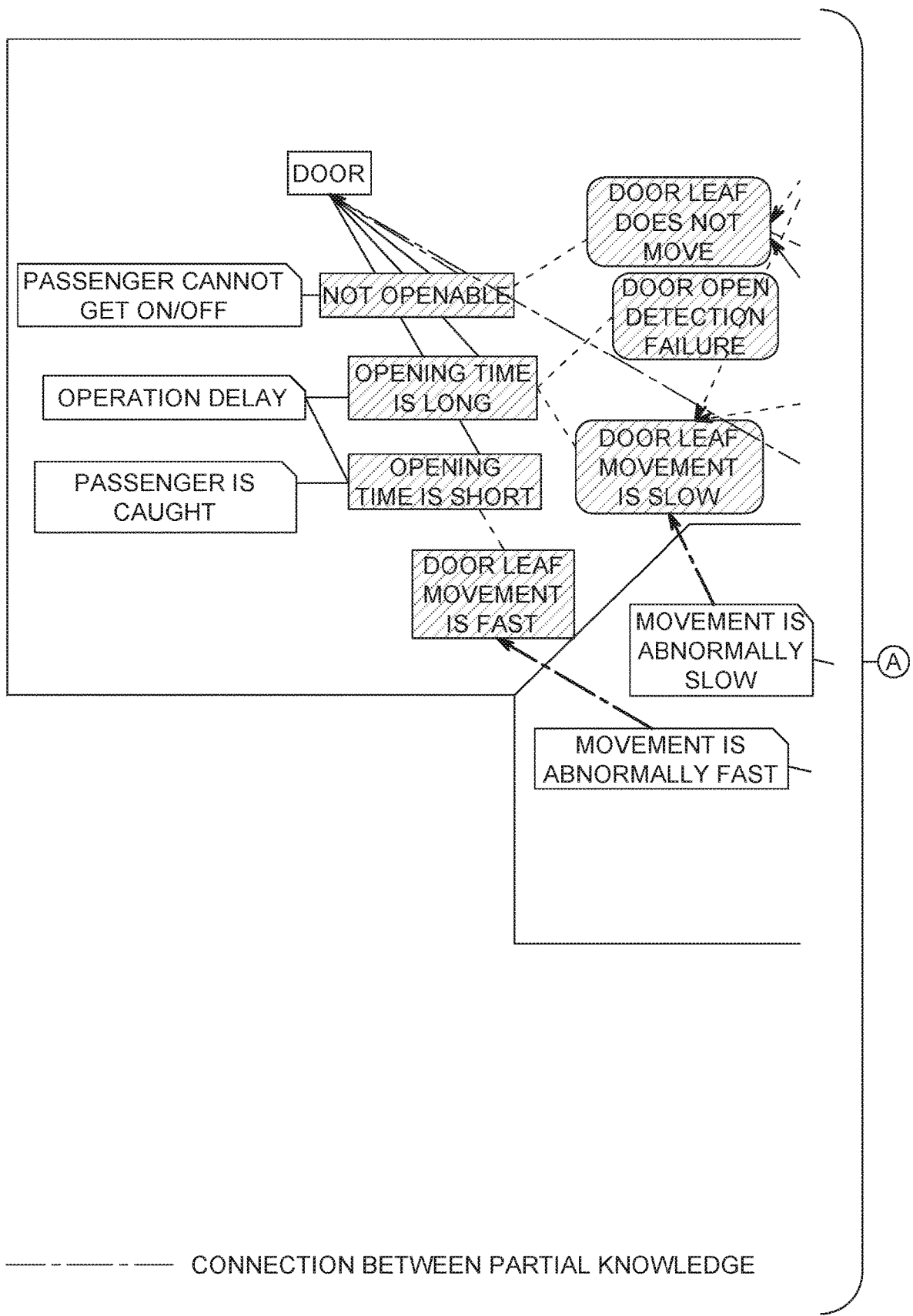
FIG. 10 is a diagram illustrating an example of failure knowledge data after reconstruction.
Figure 10B:
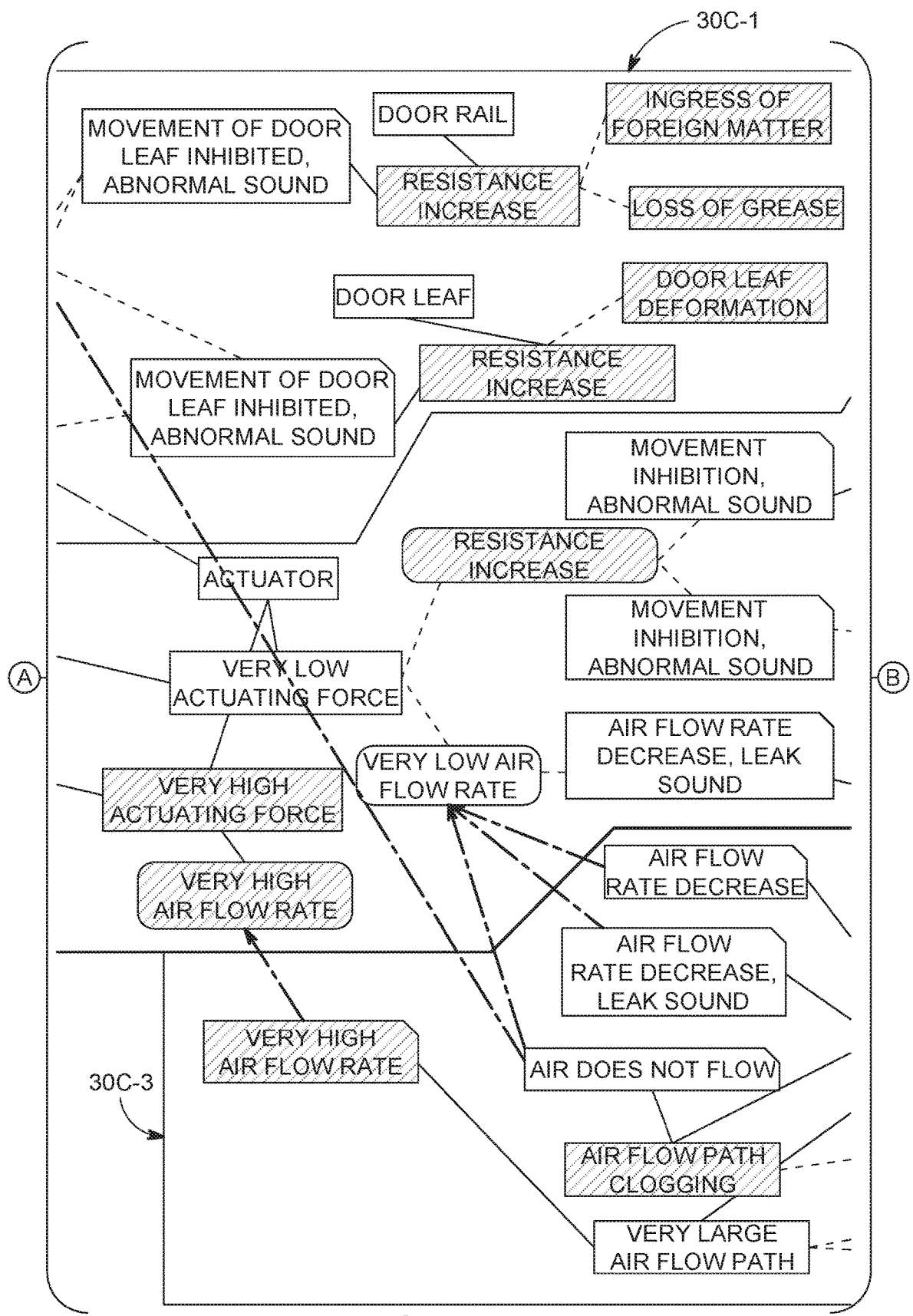
Figure 10C:
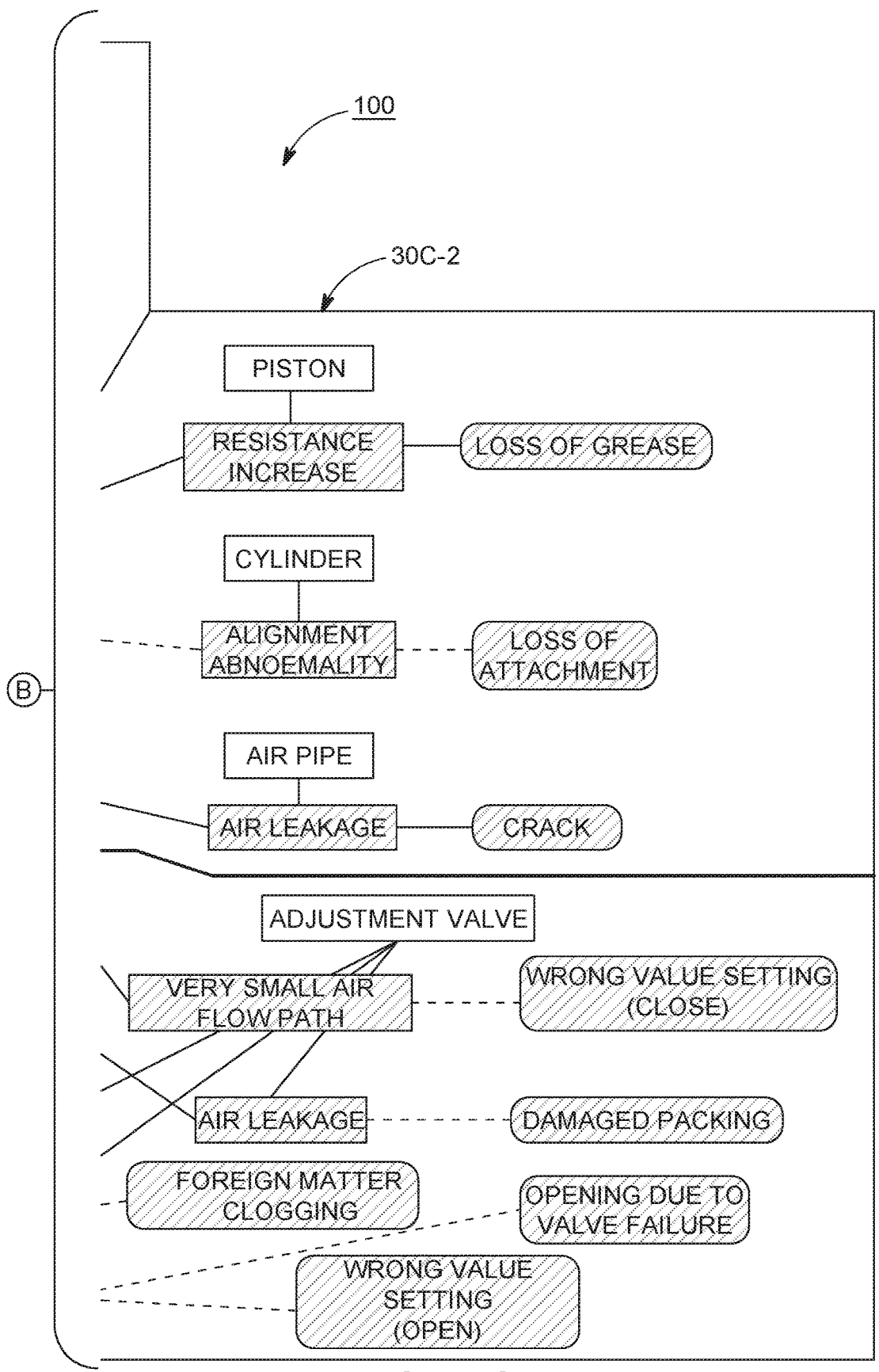

FIG. 10 is a diagram illustrating an example of failure knowledge data after reconstruction 100 after the partial knowledge connection processing (S30) is executed. In FIG. 10, a new connection relation is generated between three instances of different partial failure knowledge data 30C-1 to 30C-3. For example, between the partial failure knowledge data 30C-1 and the partial failure knowledge data 30C-2, a new connection relation is generated between "door leaf movement is fast" as the failure cause node of the door P1 and "movement is abnormally fast" as the failure effect node of the actuator P4, and a new connection relation is generated between "door leaf movement is slow" as the failure cause node of the door P1 and "movement is abnormally slow" as the failure effect node of the actuator P4. Similarly, between the partial failure knowledge data 30C-2 and the partial failure knowledge data 30C-3, a new connection relation is generated between "very-high air flow rate" as the failure cause node of the actuator P4 and "very-high air flow rate" as the failure effect node of the adjustment valve P8, and a new connection relation is generated between "very-low air flow rate" as the failure cause node of the actuator P4, "air flow rate decrease", "air flow rate decrease, leak sound", and "air does not flow" as the failure effect nodes of the adjustment valve P8. Between the partial failure knowledge data 30C-1 and the partial failure knowledge data 30C-3, a new connection relation is generated between "door leaf does not move" as the failure cause node of the door P1 and "air does not flow" as the failure effect node of the adjustment valve P8.

When the maintenance operator actually performs a failure diagnosis, the operator receives an instruction of an inspection procedure from the inspection procedure generation unit 6 through the diagnostic user interface unit 8. Here, the inspection procedure generation unit 6 presents the inspection procedure to the maintenance operator based on the failure knowledge data after reconstruction 100. Hereinafter, an operation of the inspection procedure generation unit will be described.

Figure 11:
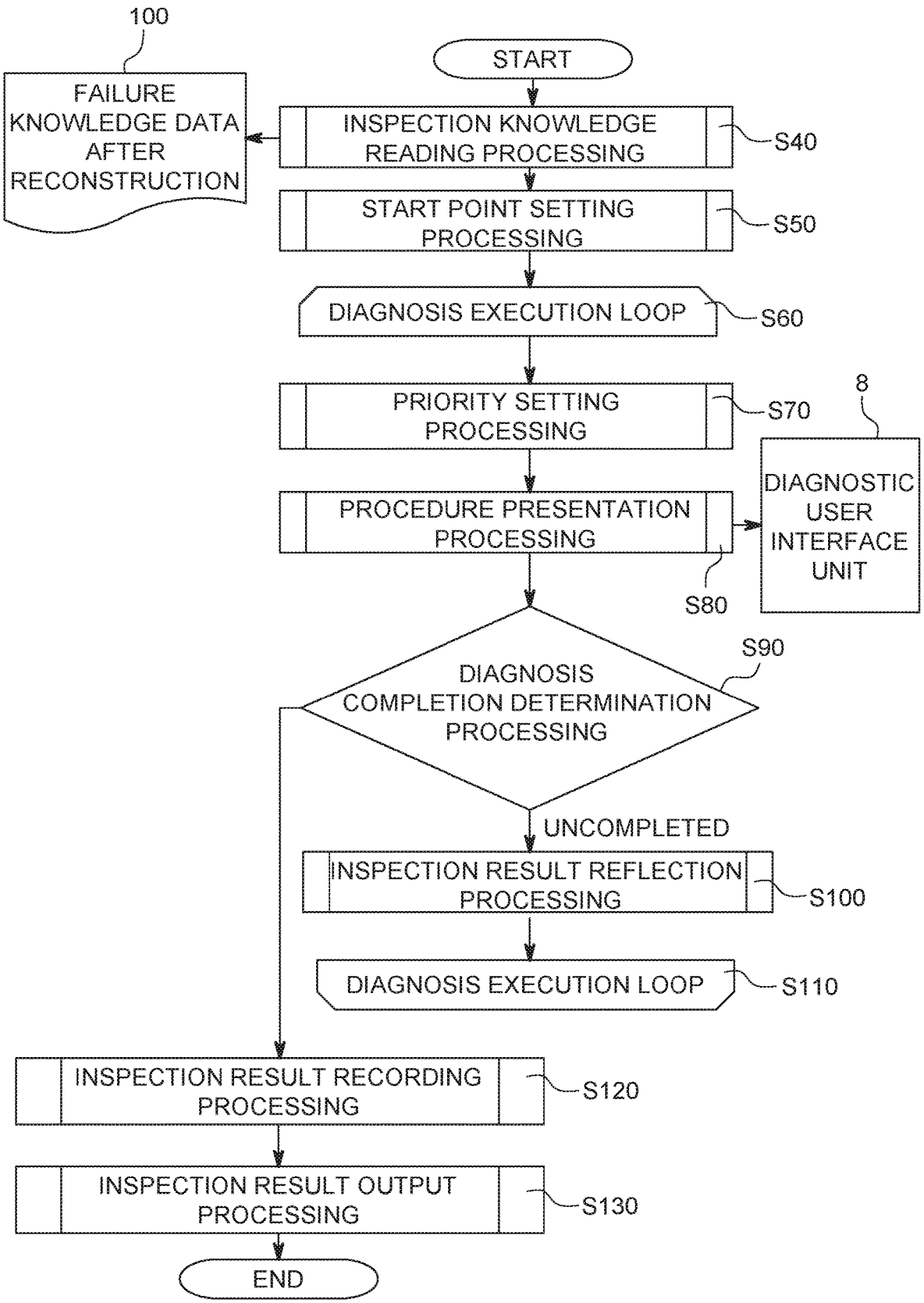
FIG. 11 is a flowchart illustrating processing of an inspection procedure generation unit.

FIG. 11 is a flowchart illustrating processing of the inspection procedure generation unit 6. First, failure knowledge reading processing (S40) of reading the failure knowledge data reconstructed 100 is executed.

Subsequently, start point setting processing (S50) of determining the component which is a start point of the inspection procedure is executed. In the start point setting processing (S50), the door P1 which is the highest component in terms of the connection relation is selected. Alternatively, when there is a preliminary failure status report before the maintenance operator starts the inspection, the component of which the content matches the most with the content of the designated component or the phenomenon at the time of the designated failure and the content of the node of the inspection knowledge is selected. Here, the door which is the highest component is set as the start point.

Thereafter, loop processing S60 to S110 is continued until the faulty parts are specified while repeating the presentation of the guide, the reception of the input of the result at the inspection stage from the operator, and the reflection of this result.

Figure 12:
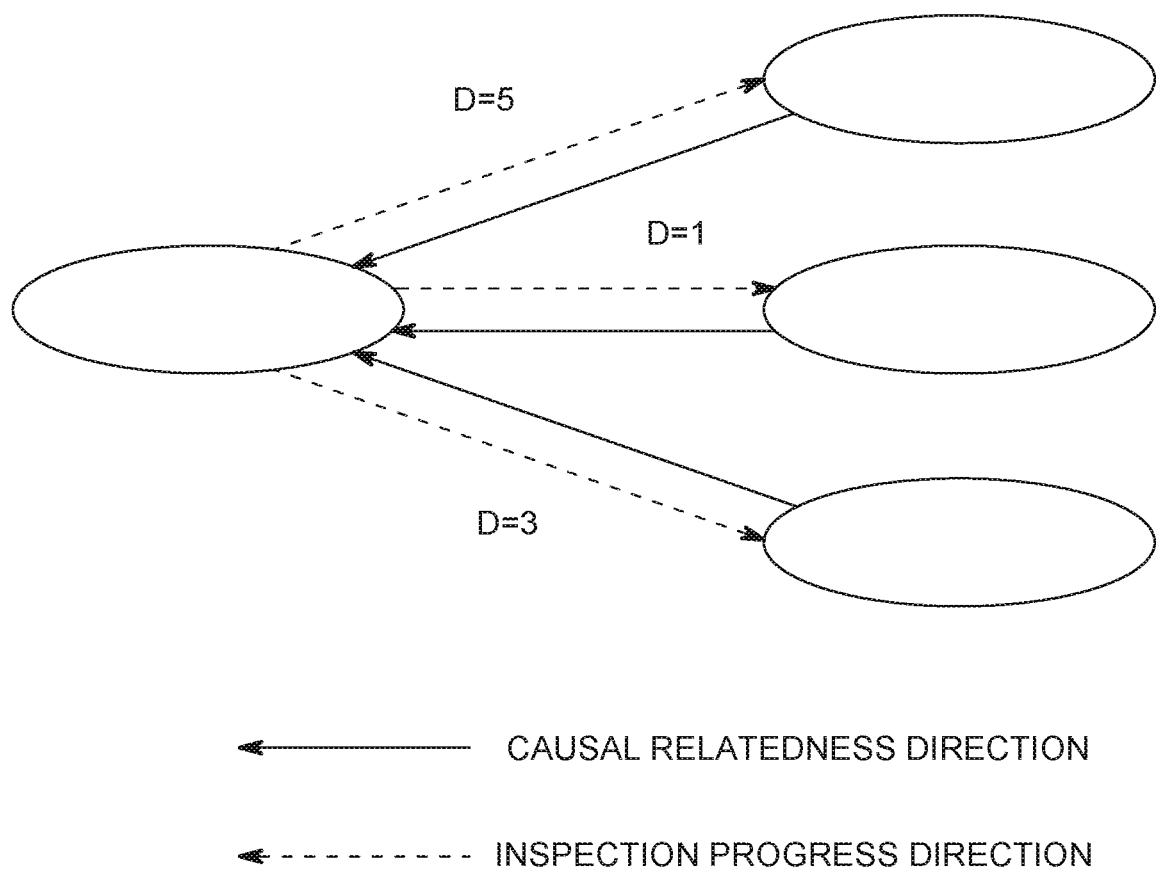
FIG. 12 is a diagram illustrating an example of an inspection procedure priority.

In priority setting processing (S70), when the guide is presented to the maintenance operator, a priority indicating an order in which the graph of the inspection knowledge data is traced is generated. Here, a priority D is a weight numerical value given between the nodes, and is the order in which the maintenance operator is recommended to confirm the node content to be proceeded to as illustrated in FIG. 12. In this case, an inspection progress of D=5 is presented with the highest priority. In the priority setting processing (S70), this priority is set such that the fault identification can be guided most easily.

Hereinafter, a method of setting the priority will be described. First, the priority D is set to a value of 0 or more. However, when D=0, the connection between the nodes is not guided. There are various methods of determining D. For example, there is a method of increasing D between the nodes in which the number of times the maintenance operator traces is large at the time of past failure inspection or a method of increasing D between the nodes connected to the failure mode in with a high appearance rate. In the present embodiment, in particular, a method specific to the inspection knowledge created by integrating the partial failure knowledges of the present invention will be described.

D is calculated as $D = 1 \times D\_1 \times D\_2 \times \ldots$ by multiplying a correction coefficient $D\_i$ which is considered from the following factors by using D=1 as a standard value. $D\_i$ is set to 1 unless otherwise specified.

Since the inspection knowledge of the present invention is created by integrating the instances of partial failure knowledge data, the partial failure knowledge data to be created differs depending on the part. Thus, when the relatedness between the nodes is evaluated, it is considered that the priority is changed depending on the partial failure knowledge data to which both the nodes belong. The correction coefficient based on the relatedness between the instances of partial failure knowledge data is $D\_1$.

When there is a connection from a certain node to the same partial failure knowledge data, the priority is corrected first such that this connection is given with the highest priority. This is because it is possible to determine that there is a high possibility that the creator creates the integrated partial failure knowledge data by recognizing that this data has a strong causal relation. When the integrated partial failure knowledge data is created by the same creator, the description content is consistent, and there is a high possibility that the description can be easily understood when the instruction is presented to the operator. At this time, for example, the correction coefficient $D\_1$ is set to $D\_1=10$.

When there is a connection from a certain node to the different partial failure knowledge data, first, the relatedness commonly included between the instances of partial failure knowledge data is prioritized, and the priority is corrected. This is because the creators of the instances of different partial failure knowledge data have commonly found out the factor, and thus, there is a high possibility that the failure is an important failure such as a high appearance rate and a large failure effect. At this time, for example, $D\_1=2$.

The priority D is corrected such that the node created from the partial failure knowledge data having a more enriched content is preferentially guided. This is because the quality of the partial failure knowledge data depends on each knowledge of the creator regarding the asset. Thus, the partial failure knowledge data created by a knowledgeable creator covers the failure knowledge such as a wider range of failure modes, and more connections of the causal relation of the failure appearance are set. Since there are few errors in the contents, there is a high possibility that the data contributes to a guide for accurately specifying faulty parts without omission. It is assumed that a correction coefficient for a rank based on a degree of enrichment of the knowledge is $D\_2$ and a reciprocal of the rank of the degree of enrichment of related partial failure knowledge data is $D\_2$.

Figure 13:
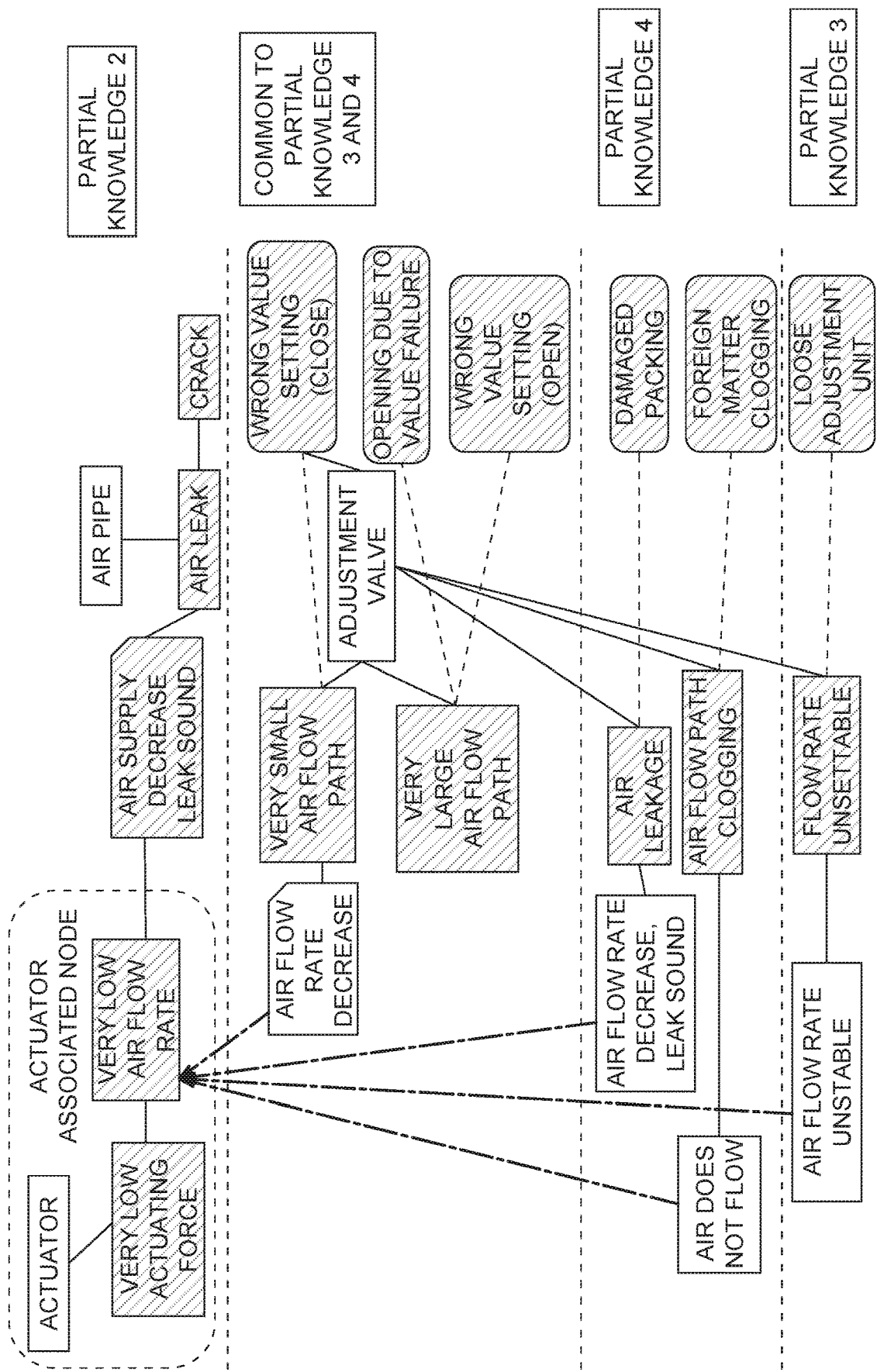
FIG. 13 is a diagram illustrating an example of a relation between instances of different partial failure knowledge data.

For example, as illustrated in the failure knowledge data 30A illustrated in FIG. 2, the partial knowledge 3 and the partial knowledge 4 describe the same adjustment valve P8, but there is a difference between the contents. FIG. 13 is a diagram illustrating a relation between a part of the partial knowledge 2, the partial knowledge 3, and the partial knowledge 4 as an example of a diagram illustrating the relation between the instances of different partial failure knowledge data. In this example, the maintenance operator attempts to inspect the details of "very-low air flow rate" which is considered to be the cause of "very-low actuating force" in the actuator P4 belonging to the partial knowledge 2.

At this time, each node connected to the failure cause node of "very-low air flow rate" is presented to the maintenance operator, but preferentially guides the failure effect node of "air supply decrease of air pipe, leak sound" belonging to the same partial knowledge 2 as the failure cause node of "very-low air flow rate" of the actuator P4. Subsequently, the failure effect node of "air flow rate decrease" common to the partial knowledge 3 and the partial knowledge 4 is guided.

Subsequently, the priority of the connection to the nodes belonging to only the partial knowledge 3 or only the partial knowledge 4 is determined. First, when the partial knowledge 3 and the partial knowledge 4 are compared, the partial knowledge having a larger number of included nodes is prioritized. The partial knowledge having the larger number of nodes is considered to be created by the creator who has the enriched failure knowledge. In this case, the partial knowledge 4 is prioritized. Thus, $D\_2=\frac{1}{3}$ is set for the nodes belonging to only the partial knowledge 3, and D_2=1 is set for the nodes belonging to only the partial knowledge 4.

As another method, when a skill level is defined for the creator of the partial failure knowledge data, the partial failure knowledge data created by the creator with a high skill standard may be prioritized.

As still another method, auxiliary information of the failure inspection associated with the failure knowledge data and the inspection knowledge created from the failure knowledge data may be used. For example, a case where a state monitoring and diagnostic sensor is attached to the target asset and a case where measurement results of measurement equipment used by the maintenance operator can be acquired, a diagnostic result using the measurement results and an analysis result useful to determine normality or abnormality by the maintenance operator can be used are considered.

Figure 14:
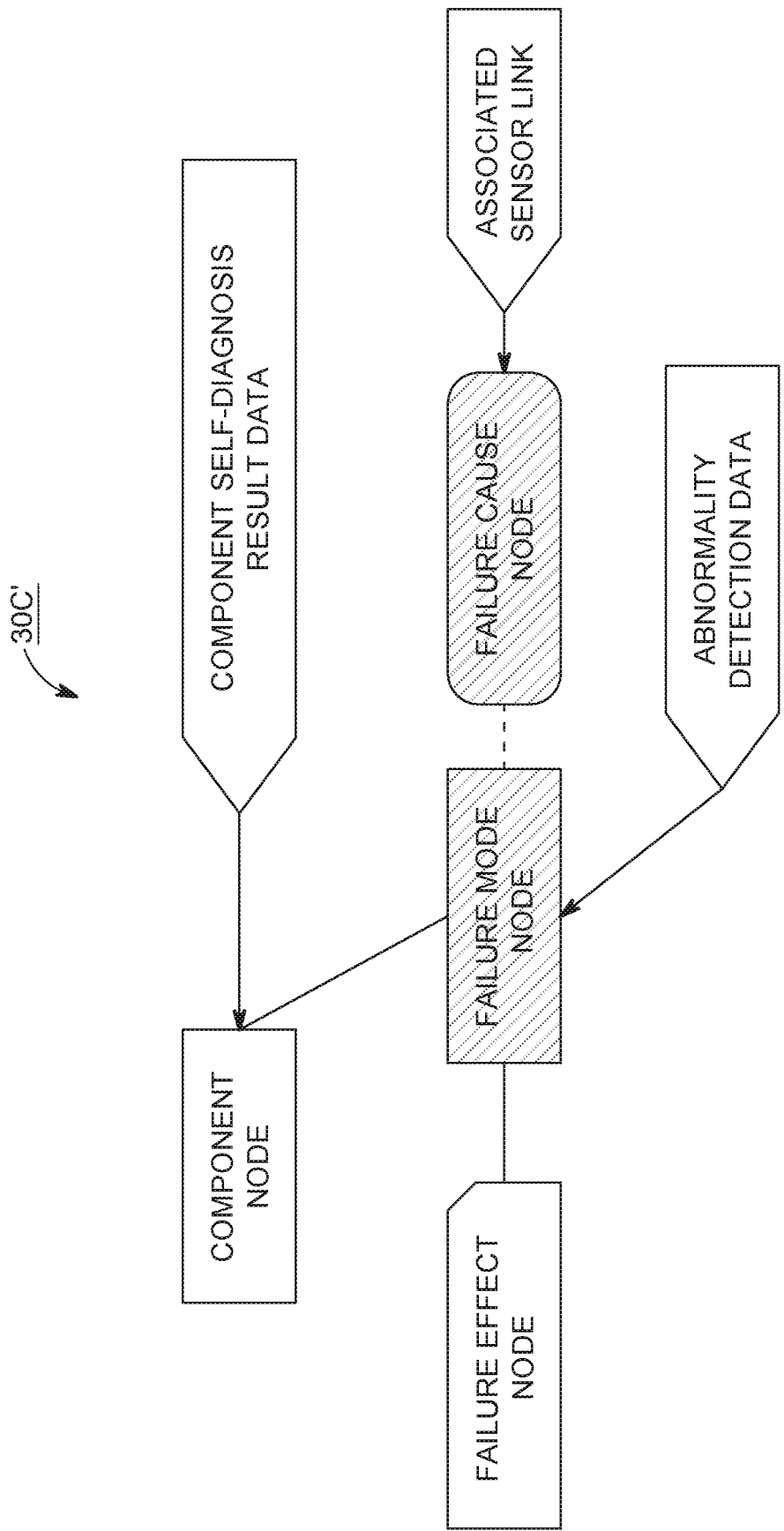
FIG. 14 is a diagram illustrating partial failure knowledge data having a link to a diagnosis result of whether or not a related abnormality occurs and sensor data useful for diagnosis.

In this case, auxiliary information useful for the inspection is defined in association with the partial failure knowledge data 30C. For example, like partial failure knowledge data 30C' illustrated in FIG. 14, a link is given to the diagnosis result of the presence or absence of a related abnormality and the sensor data useful for the diagnosis recorded in the monitor diagnostic database 2 in each node.

When the auxiliary information is given to each partial failure knowledge data, the partial failure knowledge data to which more auxiliary information is added is easier to be inspected. In order to enrich the auxiliary information, since it is necessary to scrutinize the phenomena and determination conditions when the failure appears at each node, there is a high possibility that partial failure knowledge data having high quality on which an operation of a failure mode analysis is more carefully performed is obtained when the partial failure knowledge data is created.

Thus, a partial failure knowledge data auxiliary knowledge which has a large number of added auxiliary information provided is preferentially guided. Alternatively, a definition rate of the auxiliary information is calculated by dividing the number of instances of auxiliary information included in the partial failure knowledge data by the total number of nodes, and the partial failure knowledge data having a high definition rate is preferentially guided.

By the above-described processing, it is possible to set a guide order of the nodes in the failure knowledge data of the priority setting processing (S70) based on characteristics of the partial failure knowledge data.

In addition to using the characteristics of the partial failure knowledge data, the score X indicating the node relatedness between the instances of different partial failure knowledge data generated in the inter-node relatedness measurement processing (S10) and the relatedness adjustment processing (S20) of the failure knowledge coupling unit 5 can be used for calculating the priority D. This is because as the score X becomes higher, the relatedness between the functions between the nodes and the phenomenon when the failure occurs, it is considered that there is a high possibility that the higher score is related to the factor of the failure.

As a reflection method, it is considered that the score X is set for the connection between the instances of partial failure knowledge data for which the score X is defined as a correction coefficient D_3.

Subsequently, in procedure display processing (S80), the failure knowledge data to which the priority is given is presented to the maintenance operator through the diagnostic interface unit 8.

FIG. 15 is an example of a failure inspection GUI that is generated in the procedure display processing (S80) and is displayed on the diagnostic interface unit 8. In FIG. 15, a screen is divided into a left part, a center part, and a right part. Information regarding the currently focused component and the failure mode thereof is displayed in the center part, the failure effect caused by the failure mode is displayed. Alternatively, the node for which the relatedness with the nodes to which other components belong is defined is arranged, and the factors causing the failure mode are arranged in the right part.

As for the factors causing the failure mode, the failure effect causing the currently noticed failure mode and the failure effect of the lower component causing the failure mode are displayed together. For relatedness definitions other than the failure effect, a connection destination node thereof is presented.

Since the maintenance operator is easy to understand the meaning by presenting which component the nodes such as the failure mode, the failure effect, and the failure cause appear, information on the component to which each node belongs is given.

By using the GUI illustrated in FIG. 15, the maintenance operator can confirm whether or not the failure mode displayed in the center appears by inspecting the assets, and can advance the failure inspection while using, as one of determination materials, whether or not the phenomenon defined for the failure effect and the failure cause and the relation destination node displayed in the left and light parts appears.

When the inspected failure mode appears, since information regarding more detailed inspection is presented on a right side, it is possible to inspect the status of the related lower component causing the failure mode by selecting this information. When the failure mode, the failure effect, the failure cause, or the auxiliary information for diagnosing the abnormality of the component is defined, it is possible to perform the diagnosis while referring to the diagnosis result and the related sensor data.

When the inspected failure mode does not appear, it is possible to inspect the status of the related higher component by selecting the failure effect on the left side or the abnormality of which the appearance is not confirmed among the abnormalities of higher related destinations.

When the failure mode does not appear, the maintenance operator inputs that the failure mode does not appear and is not the faulty parts through the diagnostic interface unit 8. In response to this input, it is determined that the processing is incomplete in diagnostic completion determination processing (S90) illustrated in FIG. 11. Thereafter, in inspection result reflection processing (S100), since it is not necessary to further inspect the failure mode in which it is confirmed that the failure does not appear, the failure effect caused by the failure mode, and the failure cause causing the failure mode, a weight D connected to these nodes is set to zero.

When it is not confirmed whether or not the failure effect appears, when the failure can be caused by another failure mode in which the failure appears or the node having a relatedness with other types, or when the failure cause is related to another failure mode, only the weight D connected to the failure mode is set to zero. The mode simultaneously moves to the failure mode in which it is confirmed whether or not the failure effect appears before the attention is focused on a failure mode of interest displayed in the center part. Accordingly, in the next inspection step, the connection related to the confirmed failure mode is not displayed on the GUI, and it is possible to narrow down and present the next inspection target to the maintenance operator.

The maintenance operator can perform the diagnosis using the inspection knowledge by using such a GUI, but it is possible to instruct the user to present a more efficient procedure by using the weight D previously generated in the priority setting processing (S70) at this time.

For example, when the failure mode of interest appears, the details are further inspected by selecting a factor candidate such as the failure effect displayed in the right part, but inspection efficiency changes depending the order in which the inspection is advanced. For highly efficient surveys, it is considered that a relatively probable factor is selected and the factor to be easily inspected is preferentially confirmed.

In order to realize this, it is possible to urge the user to preferentially perform the inspection by displaying the connection with a higher priority D at an upper part of the GUI. In addition to the display at the upper part, it is also possible to perform a method of giving a mark on a candidate having a high priority or changing a display color.

In the example of FIG. 15, the failure effect of the lower component connected through the very-low air flow rate of the related failure effect is displayed in the right part for the failure mode of interest of the actuator with a very-low actuating force in the center part. This display order is the order in which the failure effect common to the partial knowledge 3 and the partial knowledge 4, the failure effect related to the partial knowledge 4, and the failure effect related to the partial knowledge 3 among the failure effect of the air pipe belonging to the same partial knowledge and the failure effects related to the adjustment valve of the partial knowledge 3 and partial knowledge 4 different from each other are displayed based on the previous result of the weight creation using the partial failure knowledge data. Accordingly, it is possible to perform the inspection in consideration of the strength of the causal relatedness strength, the degree of enrichment of the knowledge, and the like which are taken into consideration when the priority setting processing (S70), and it is possible to perform a high-efficiency fault identification operation.

Figure 16A:
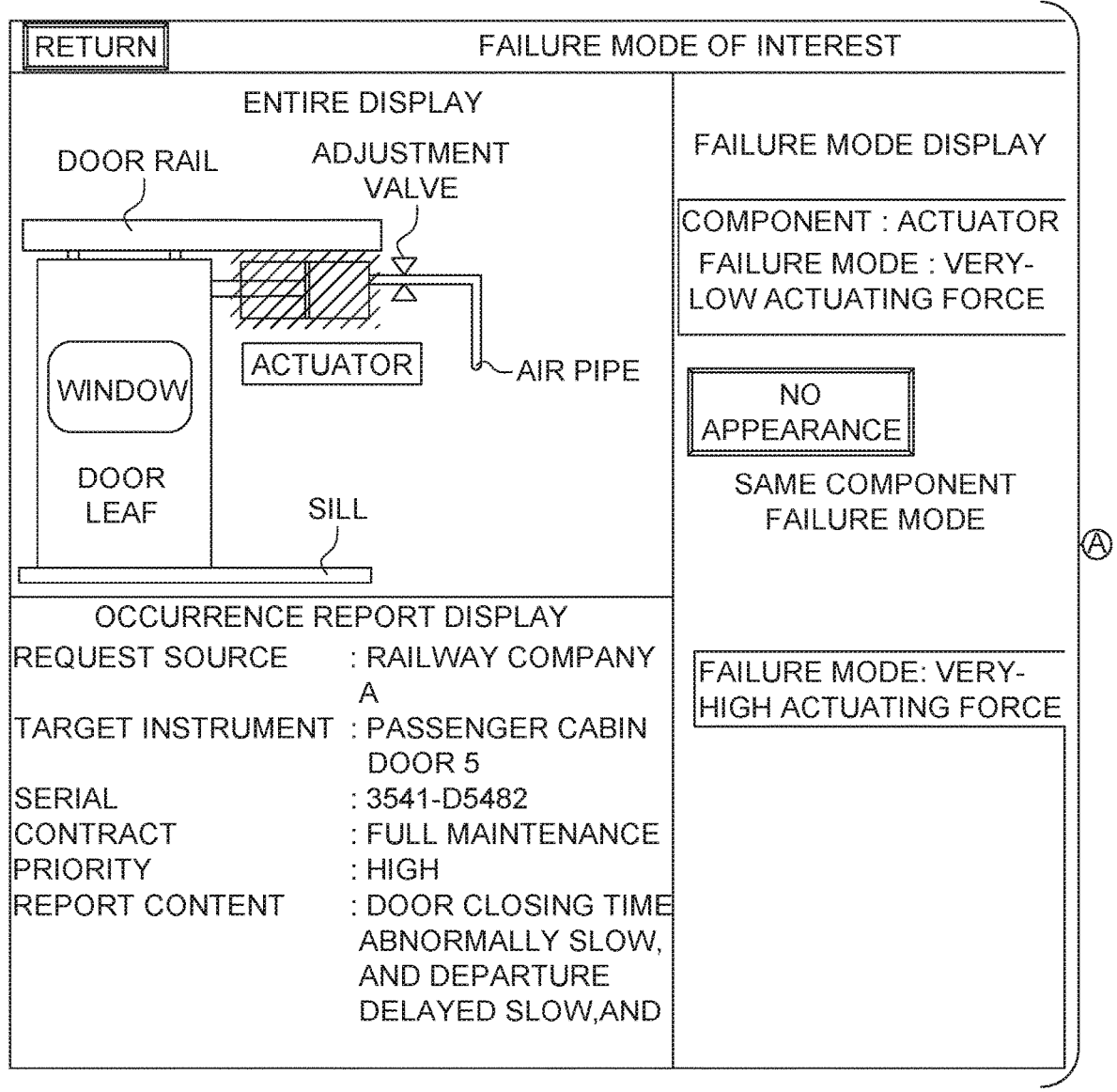
FIG. 16 is a diagram illustrating another example of the failure inspection GUI.
Figure 16B:
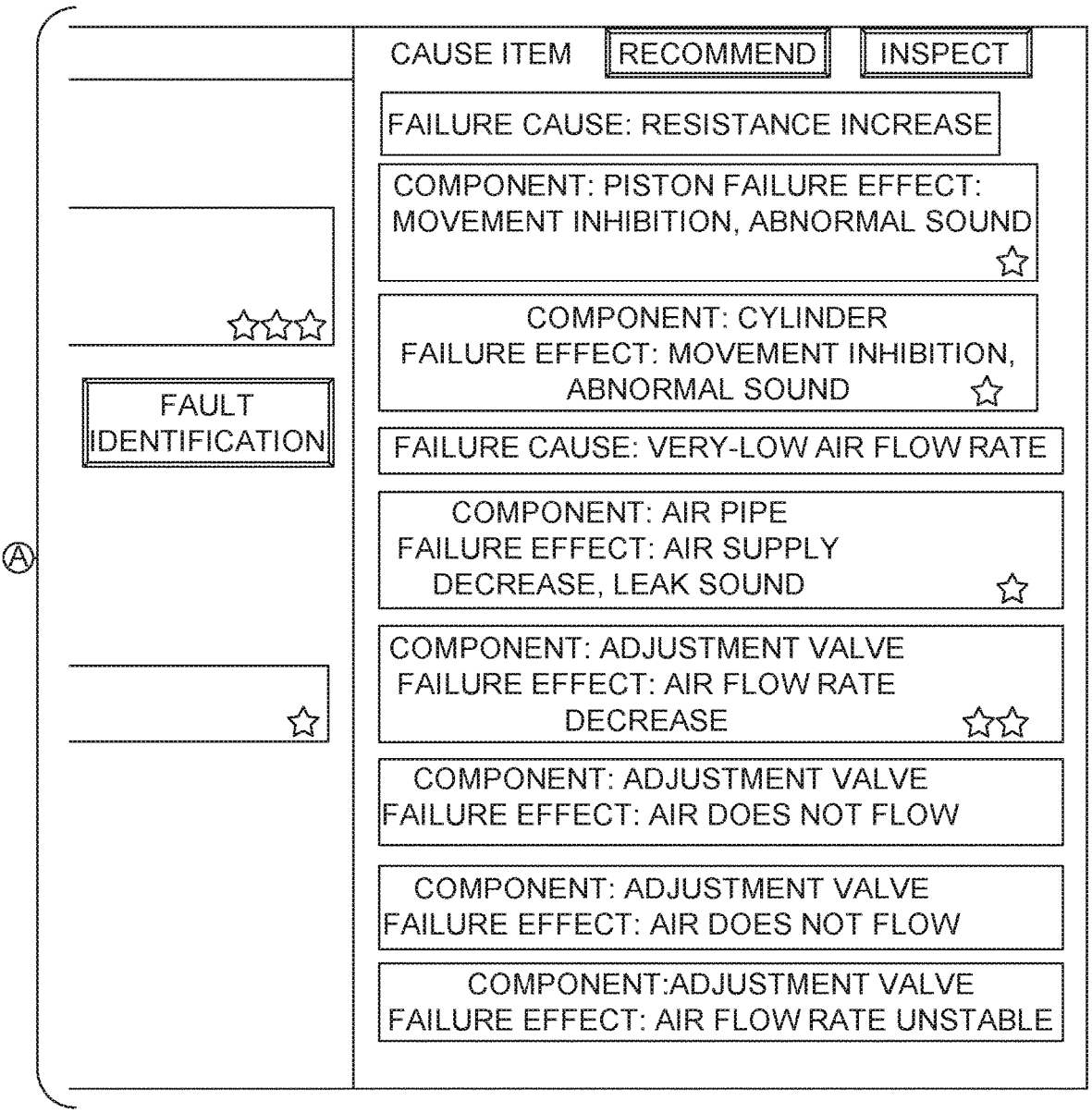

FIG. 16 is another example of the failure inspection GUI displayed on the diagnostic interface unit 8. In the case of the failure inspection GUI illustrated in FIG. 16, the drawing of the asset and the content of the reported abnormality are displayed on the left side of the screen. Accordingly, the failure inspection GUI assists for the maintenance operator in specifying the faulty parts. The portions of the actuator are hatched in the drawing of the asset, but these hatched portions highlight the portions corresponding to the component as the current inspection target having the failure mode displayed in the center part. By highlighting such hatching, it is possible for the maintenance operator to easily grasp the current inspection portion and the overall image of the asset.

Unlike the failure inspection GUI illustrated in FIG. 15, in the case of the failure inspection GUI illustrated in FIG. 16, the failure effect caused by the failure mode displayed in the center part or the node for which the relatedness with the node to which another component belongs is defined are not displayed. Thus, it is possible to return to the failure mode previously inspected by arranging a button to return to the previous inspection step and clicking by the operator.

The maintenance operator specifies, as the inspection result of the faulty parts, the failure mode in which the failure appears and is not related to the failure of the lower component for which the relatedness is defined, or the failure mode and the failure cause thereof by tracing the inspection knowledge described above and repeating the confirmation of whether or not each failure mode appears according to the guide. The specified failure mode is designated through the diagnostic interface unit 8, and thus, it is determined that the processing is completed in the diagnostic completion determination processing (S90) illustrated in FIG. 11. Thereafter, the fault identification operation is ended by recording the specified failure mode in the failure inspection result database 4 in inspection result recording processing (S120) and displaying the specified failure mode in a report form on the screen in inspection result output processing (S130).

By the above-described processing, when the instances of divided and created partial failure knowledge data are integrated into the integrated inspection knowledge and the inspection knowledge is presented to the operator, the fault identification assistance system of instructing a procedure having a high inspection efficiency in consideration of the characteristics of the partial failure knowledge data is realized.

The failure knowledge data is defined by the combination of the component, the failure effect, the failure mode, and the failure cause, but it is possible to integrate fragmentary failure knowledges not including all the elements thereof as the partial knowledges into the inspection knowledge.

For example, even though only the failure mode is defined for a certain component and the failure effect and failure cause are not defined, the inter-node relatedness measurement processing (10) in the failure knowledge coupling unit 5, it is possible to extract the relation between the failure mode and the failure cause and the failure mode of the higher component without using the relation between the component and other components or the failure effect.

In the case of the fragmentary knowledge, since there is a high possibility that the details of the failure are not sufficiently examined, a correction coefficient of 1 or less such as $D\_1=0.5$ is applied to the connection related to the fragmentary knowledge.

Figure 17:
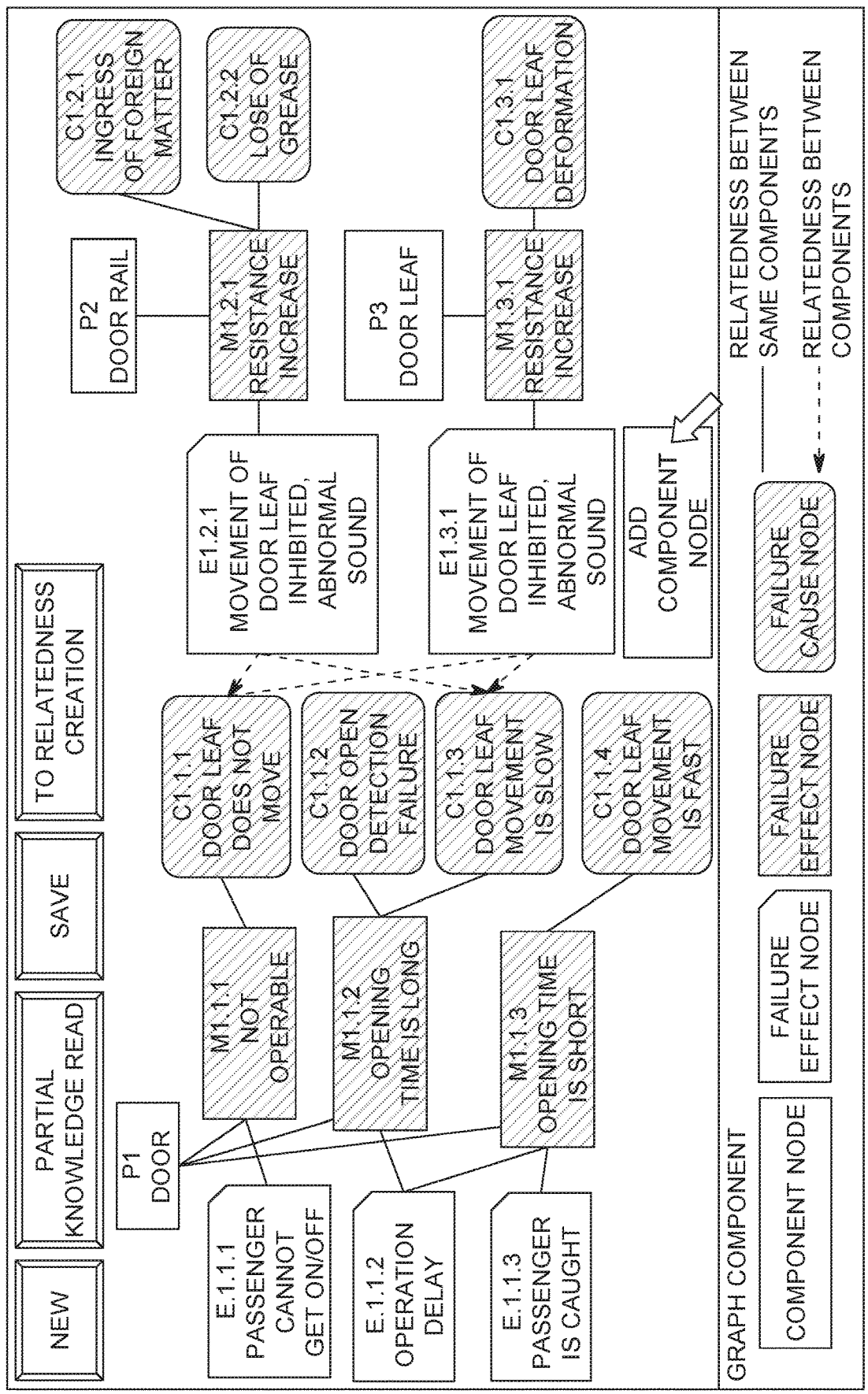
FIG. 17 is a diagram illustrating an example of a GUI for creating the partial failure knowledge data.

The failure knowledge creation unit 7 and the creation user interface unit 9 are used to create the partial failure knowledge data. As the creation method, the partial failure knowledge data illustrated in FIG. 4 is created using the GUI. FIG. 17 is a diagram illustrating an example of the GUI for creating the partial failure knowledge data. On the GUI for creating the partial failure knowledge data, the graph data illustrated in FIG. 4 is displayed, and the partial failure knowledge data is created by adding or deleting the node or adding or deleting the connection.

Figure 18:
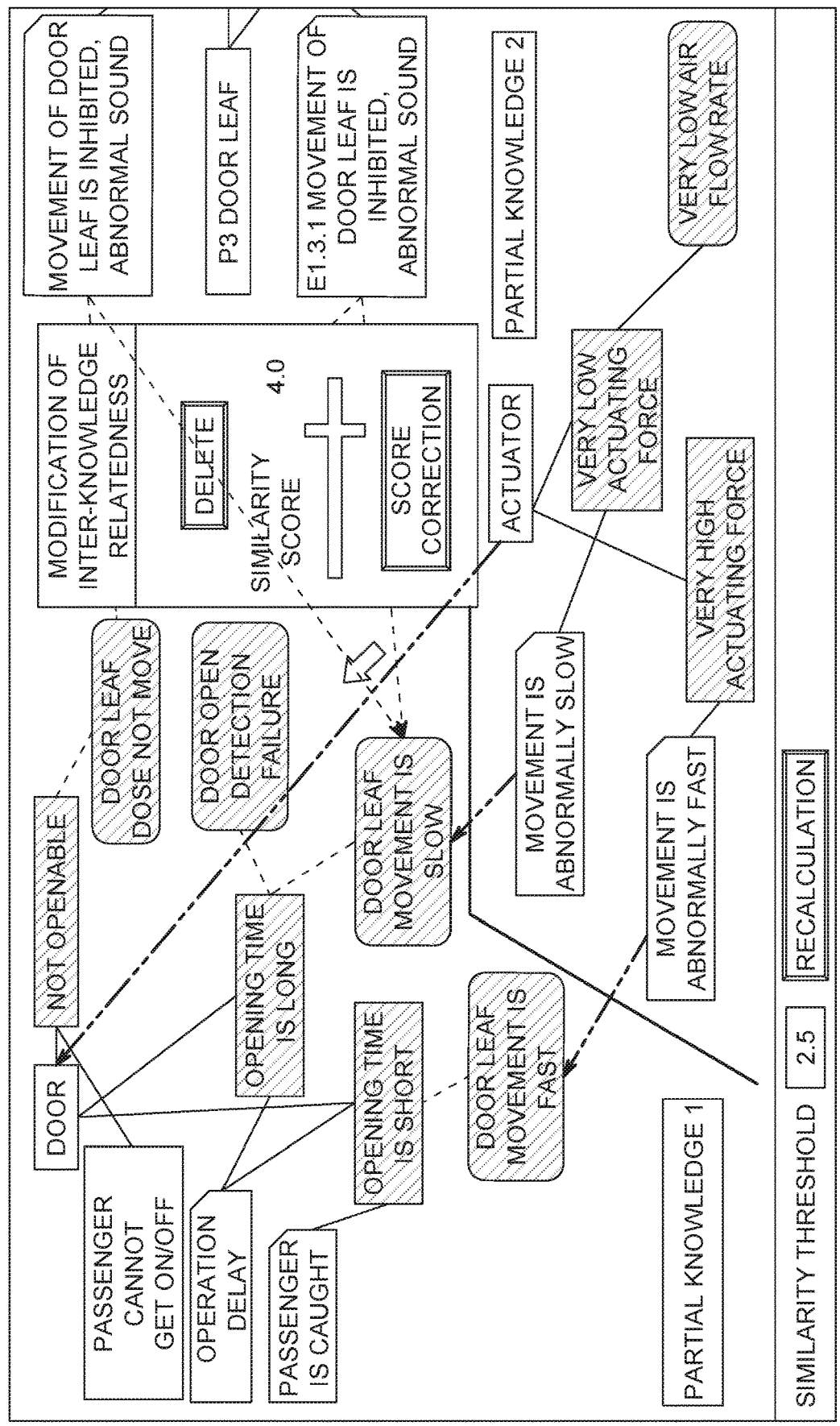
FIG. 18 is a diagram illustrating an example of a GUI for creating a relatedness between instances of partial failure knowledge data.

Not only the creation of the partial failure knowledge data, but the relatedness between the instances of partial failure knowledge data may be created or corrected by using the knowledge of the creator. FIG. 18 is a diagram illustrating an example of a GUI for creating the relatedness between the instances of partial failure knowledge data. On the GUI for creating the relatedness between the instances of partial failure knowledge data, the processing in the failure knowledge coupling unit 5 is executed by pressing an inter-knowledge relatedness button, and the generated inspection knowledge is displayed.

At this time, when the displayed connection between the knowledges is inappropriate from the knowledge of the creator regarding the target asset, the creator deletes the inappropriate connection. Alternatively, when it is determined that the relatedness which is not displayed in the automatic generation is necessary from the knowledge of the creator, the connection is manually added. The score X of the similarity between the connections may be set manually.

In this case, the automatically calculated score X is presented first, and the creator corrects the score X by using a slide bar or the like. The creator may adjust the threshold value T used in the relatedness adjustment processing (S20). The creator can adjust the threshold value to an appropriate threshold value in which the relatedness between the instances of generated partial failure knowledge data is most probable by applying the processing of the inspection procedure generation unit 6 while changing the threshold value.

Second Embodiment

In addition to the configuration of the first embodiment, in the present embodiment, it is possible to more efficiently and accurately perform the fault identification operation by generating an inspection procedure screen listing inspection method for confirming an appearance state and details of the currently focused failure mode for the maintenance operator and presenting the inspection procedure screen to the maintenance operator.

The "inspection" in the present embodiment indicates an operation of determining whether or not a specific phenomenon (the appearance of the failure mode, the failure effect, or the failure cause, and the like) occurs, and the "inspection" indicates a series of fault identification operations (including "inspections").

Figure 19:
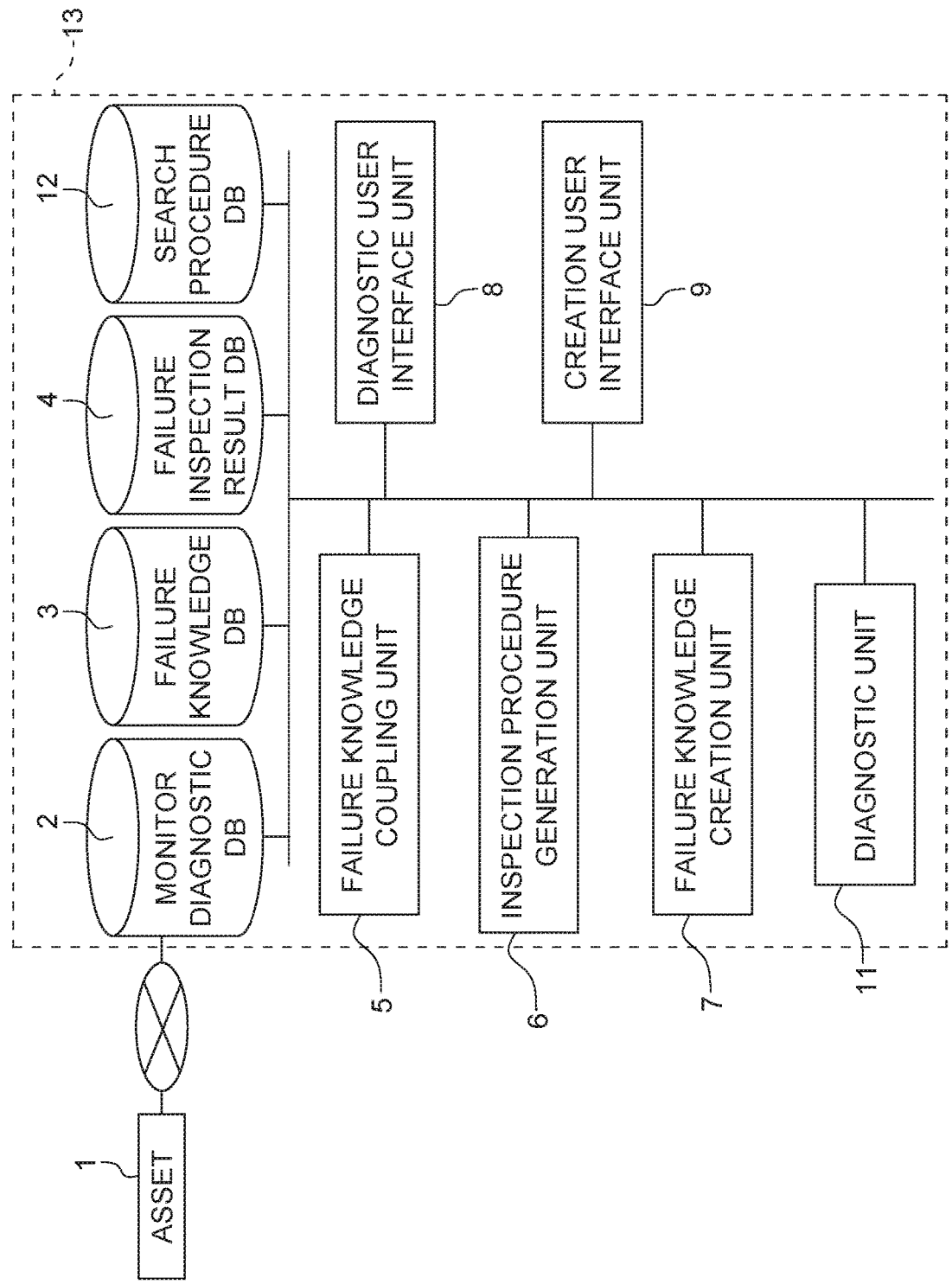
FIG. 19 is a configuration diagram of a fault identification assistance system in a second embodiment.

FIG. 19 is a configuration diagram illustrating a fault identification assistance system 13 of the asset 1. The fault identification assistance system 13 includes a diagnostic unit 11 and a search (inspection) procedure database 12 (hereinafter, referred to as an inspection procedure database 12) in addition to the configuration of the fault identification assistance system 10 described in the first embodiment. The diagnostic unit 11 is realized by a central processing unit (CPU) or a program recorded in read only memory (ROM) or the RAM, and the inspection procedure database 12 is realized by storage means such as a hard disk drive (HDD) or a random access memory (RAM). However, the present invention is not limited thereto.

The diagnostic unit 11 determines a state of the asset by using a sensor provided on the asset and a procedure defined in advance in the inspection procedure database 12. In the inspection procedure database 12, a procedure for determining whether or not the specific phenomenon (the appearance of the failure mode, the failure effect, or the failure cause) occurs in the failure knowledge data 30A is recorded as inspection procedure data.

Figure 21A:
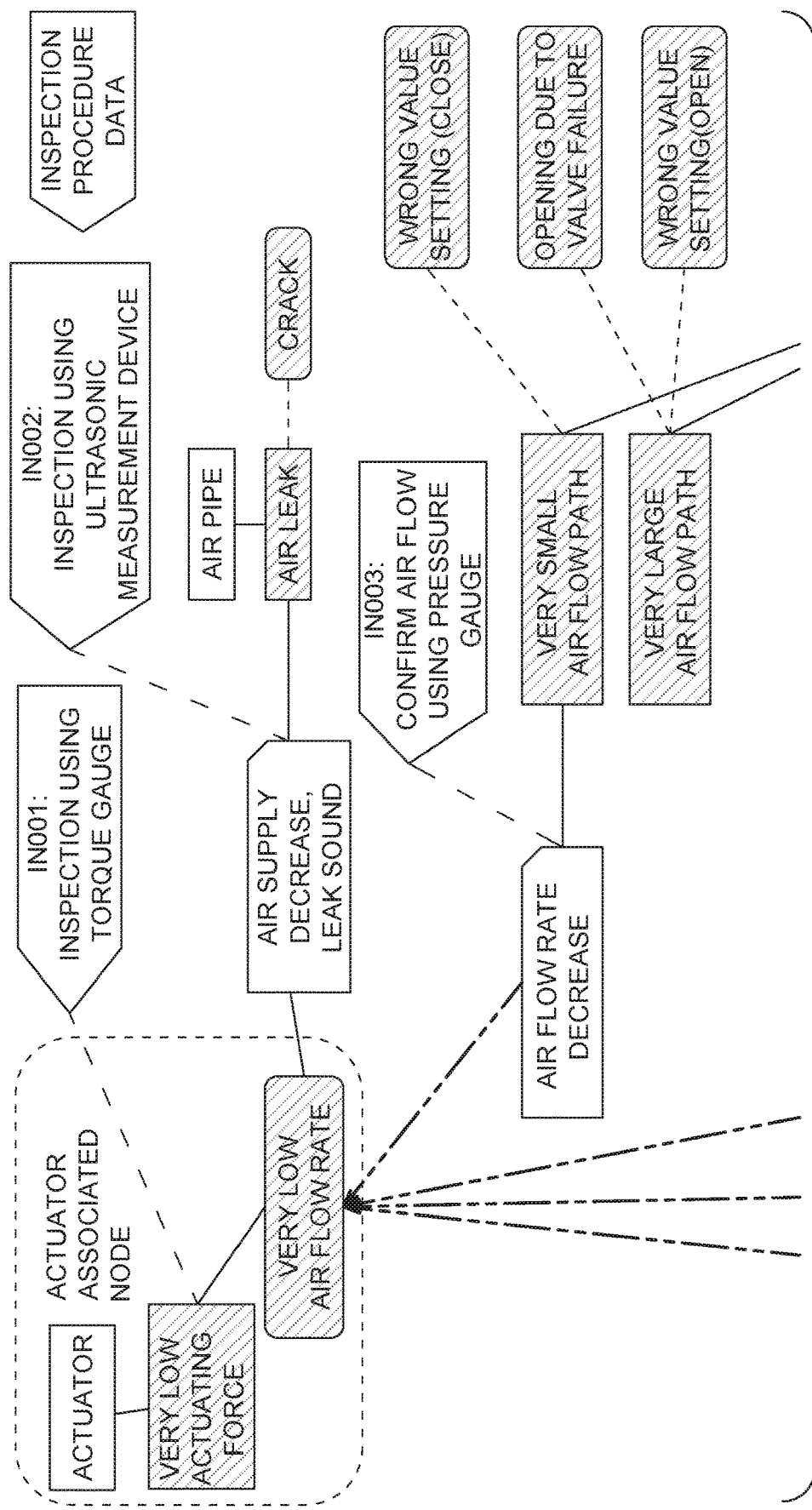
FIG. 21 is a diagram illustrating a data structure in which inspection procedure data and failure knowledge data are combined.
Figure 21B:
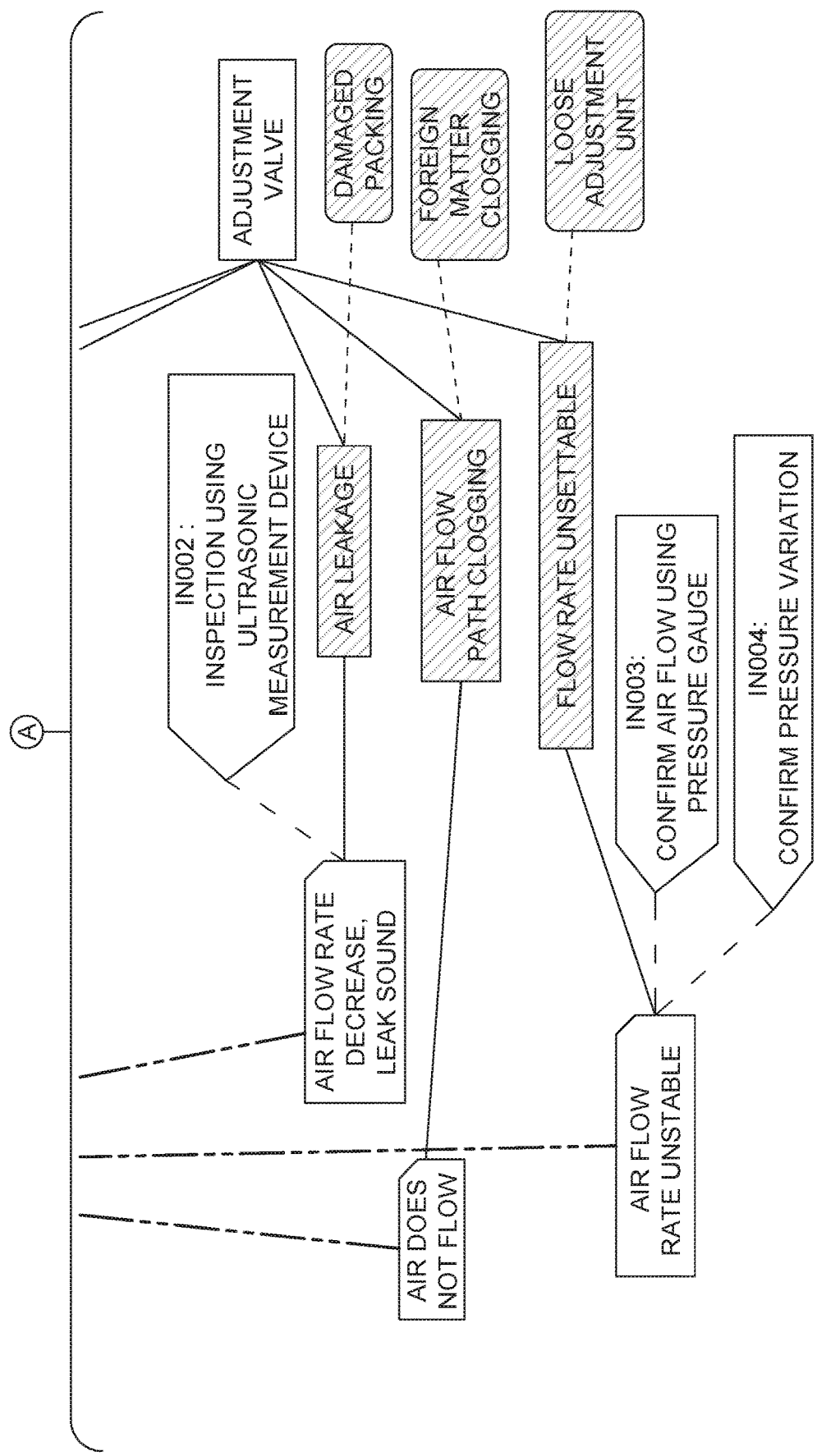

FIG. 20 is a diagram illustrating an example of inspection procedure data. Inspection procedure data 400 saves a confirmation procedure performed by the maintenance operator or an automatic determination procedure used by the diagnostic unit 11 when there is a sensor provided on the asset. An inspection item ID 401 is a unique ID assigned to each inspection item, and an inspection target ID 402 corresponds to the ID 33 of the failure mode of the failure knowledge data 30A illustrated in FIG. 2. An inspection type 403 indicates either manual inspection and measurement performed by the maintenance operator or automatic measurement performed by the diagnostic unit 11. An inspection method 404 indicates a method of the manual inspection and measurement performed by the maintenance operator or the automatic measurement performed by the diagnostic unit 11. When it is possible to confirm whether or not a plurality of abnormalities appears in the common inspection, the same inspection item may be defined for a plurality of inspection targets. When the contents of the inspection procedure data 400 and the contents of the failure knowledge data 30A are illustrated together, the data structure illustrated in FIG. 21 is obtained.

The diagnostic unit 11 performs the inspection procedure in which the inspection type 403 is automatic in advance among the inspection procedures included in the inspection procedure data 400 by using monitor diagnostic data recorded in the monitor diagnostic database 2 when the fault identification operation is performed, and delivers the result to the inspection procedure generation unit 6.

In the inspection procedure in the present embodiment, in the priority setting processing (S70) in the inspection procedure generation unit 6, it is possible to decrease the guide priority of the node in which the failure does not occur by setting, as the connection coefficient, a small value such as D_insp=0.1 for the connection to the node in which it is determined that the problem does not occur by the automatic diagnosis result of the diagnostic unit 11.

The inspection procedure generation unit 6 presents the inspection procedure to the diagnostic user interface unit 8. When the maintenance operator confirms whether or not each failure mode appears and there is the inspection procedure data linked to the failure mode, the maintenance operator can efficiently and accurately perform the fault identification by presenting the inspection procedure data as the inspection procedure.

It is possible to generate the inspection procedure GUI by tracing the nodes connected to a lower direction from the nodes of the failure modes as the current inspection targets based on the fact that the contents of the inspection procedure data 400 and the failure knowledge data 30A have directed graph structures illustrated in FIG. and creating the list of the nodes of the inspection procedure data connected to the nodes connected to the lower direction.

Figure 22:
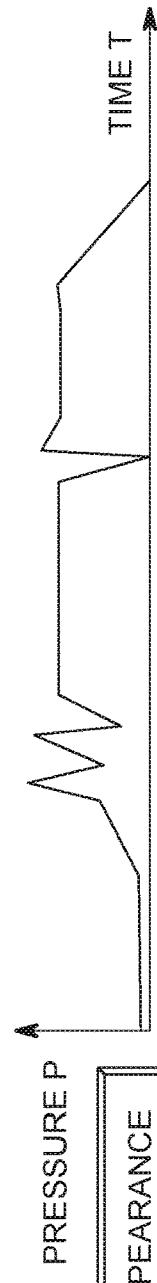
FIG. 22 is a diagram illustrating an example of an inspection procedure screen.

FIG. 22 is a diagram illustrating an example of this inspection procedure screen. In this example, the inspection procedure GUI is generated when "very-low actuating force of actuator" is the failure mode of interest. The operator can perform the inspection while seeing the list screen by generating a screen that summarizes instances of inspection procedure data of IN001, IN002, IN003, and IN004 which are lower than "very-low actuating force of actuator", and it is possible to perform an efficient operation. It is also possible to simultaneously present the associated sensor data.

Through the above-described processing, the fault identification operation can be more efficiently and accurately advanced by presenting the inspection method of confirming the appearance state and details of the currently focused failure mode to the maintenance operator.

REFERENCE SIGNS LIST 1 asset
10 fault identification assistance system
2 monitor diagnostic database
3 failure knowledge database
4 failure inspection result database
5 failure knowledge coupling unit
6 inspection procedure generation unit
7 failure knowledge creation unit
8 diagnostic user interface unit (diagnostic interface unit)
9 creation user interface unit

The invention claimed is:
1. A maintenance operation assistance system, comprising:

a failure knowledge database in which failure knowledge data regarding a failure of an asset is recorded;

a failure knowledge coupling unit that reconstructs, as integrated failure knowledge data, a plurality of instances of partial failure knowledge data which is instances of the failure knowledge data created by being partially divided; and an inspection procedure generation unit that presents an inspection procedure to a maintenance operator by using the integrated failure knowledge data, wherein the failure knowledge coupling unit evaluates and adjusts a relatedness between description contents of instances of different partial failure knowledge data in nodes among the plurality of instances of partial failure knowledge data, and generates the failure knowledge data after reconstruction by connecting the instances of different partial failure knowledge data, and the inspection procedure generation unit sets priorities when the inspection procedure is presented to the maintenance operator by the failure knowledge data after reconstruction, and presents the inspection procedure to a diagnostic interface unit based on the priorities.

2. The maintenance operation assistance system according to claim 1, wherein the plurality of instances of partial failure knowledge data include information regarding a target component of the asset, a failure mode, a failure cause causing the failure mode, and a failure effect due to the failure mode.

3. The maintenance operation assistance system according to claim 1, wherein the failure knowledge coupling unit calculates a score indicating the relatedness in consideration of a textual similarity between the description contents in the nodes, a coincidence between types of the nodes, and a distance on a structural development.

4. The maintenance operation assistance system according to claim 3, wherein, when the score is less than a predetermined threshold value, since there is no relatedness between the instances of different partial failure knowledge data in the nodes, the failure knowledge coupling unit deletes the score.

5. The maintenance operation assistance system according to claim 4, wherein the failure knowledge coupling unit deletes a connection relation from a higher component to a lower component that is a part of the higher component, or a connection relation from a function of the higher component to a function of the lower component.

6. The maintenance operation assistance system according to claim 1, wherein, when a relatedness between the nodes is evaluated, the inspection procedure generation unit changes the priorities based on relatedness between the plurality of instances of partial failure knowledge data to which the nodes belong.

7. The maintenance operation assistance system according to claim 1, wherein the inspection procedure generation unit changes the priorities based on degrees of enrichment of the plurality of instances of partial failure knowledge data.

8. The maintenance operation assistance system according to claim 1, wherein the inspection procedure generation unit preferentially presents a node belonging to a same partial failure knowledge data of the node as an inspection target, and presents the node commonly belonging to the instances of different partial failure knowledge data.

9. The maintenance operation assistance system according to claim 1, further comprising:

a failure knowledge creation unit that creates the plurality of instances of partial failure knowledge data, wherein the plurality of instances of partial failure knowledge data is created by adding or deleting a node or a connection between the nodes in a creation interface unit.

10. The maintenance operation assistance system according to claim 1, further comprising:

a diagnostic unit that executes measurement of the asset by using a sensor provided at the asset; and an inspection procedure database in which inspection procedure data indicating a procedure for determining whether or not a specific phenomenon occurs is recorded, wherein the inspection procedure generation unit presents the procedure to the diagnostic unit.

* * * * *